(12) United States Patent
Kijima et al.

(10) Patent No.: US 11,607,707 B2
(45) Date of Patent: Mar. 21, 2023

(54) METHOD FOR VIBRATING A VIBRATION DEVICE

(71) Applicant: TDK CORPORATION, Tokyo (JP)

(72) Inventors: Kaoru Kijima, Tokyo (JP); Kazuki Saito, Tokyo (JP)

(73) Assignee: TDK CORPORATION, Tokyo (JP)

( * ) Notice: Subject to any disclaimer, the term of this patent is extended or adjusted under 35 U.S.C. 154(b) by 782 days.

(21) Appl. No.: 16/232,431

(22) Filed: Dec. 26, 2018

(65) Prior Publication Data

US 2019/0201934 A1 Jul. 4, 2019

(30) Foreign Application Priority Data

Dec. 28, 2017 (JP) .............................. JP2017-253068

(51) Int. Cl.
| | |
|---|---|
| *B06B 1/06* | (2006.01) |
| *H01L 41/047* | (2006.01) |
| *B06B 1/02* | (2006.01) |
| *H01L 41/09* | (2006.01) |
| *H01L 41/083* | (2006.01) |
| *H01L 41/04* | (2006.01) |
| *G10K 9/125* | (2006.01) |

(52) U.S. Cl.
CPC .......... *B06B 1/0238* (2013.01); *B06B 1/0603* (2013.01); *B06B 1/0611* (2013.01); *G10K 9/125* (2013.01); *H01L 41/042* (2013.01); *H01L 41/0475* (2013.01); *H01L 41/083* (2013.01); *H01L 41/0973* (2013.01)

(58) Field of Classification Search
CPC . H01L 41/042; H01L 41/0475; H01L 41/083; H01L 41/0973; B06B 1/06; B06B 1/0603; B06B 1/0611
See application file for complete search history.

(56) References Cited

U.S. PATENT DOCUMENTS

| | | | |
|---|---|---|---|
| 2003/0111933 A1* | 6/2003 | Gallmeyer | ............ H01L 41/042 310/317 |
| 2006/0239844 A1 | 10/2006 | Nakayama | |
| 2011/0068658 A1* | 3/2011 | Kamitani | ................ F04D 27/00 310/316.01 |

(Continued)

FOREIGN PATENT DOCUMENTS

| | | |
|---|---|---|
| JP | H08-251954 A | 9/1996 |
| JP | 2004-058695 A | 2/2004 |

(Continued)

*Primary Examiner* — Derek J Rosenau
(74) *Attorney, Agent, or Firm* — Oliff PLC

(57) ABSTRACT

A vibration device includes a piezoelectric element, a vibration member to which the piezoelectric element is bonded, and a wiring member connected with the piezoelectric element. A method for vibrating the vibration device includes inputting a signal including a fundamental frequency component to the piezoelectric element through the wiring member, and vibrating the vibration device in a vibration mode that includes the fundamental frequency component and does not approximately include a high order frequency component that is n times (n represents an integer of 2 or more) the fundamental frequency component. The fundamental frequency component is lower than the resonance frequency component of the vibration device.

8 Claims, 23 Drawing Sheets

(56) References Cited

U.S. PATENT DOCUMENTS

| | | | |
|---|---|---|---|
| 2014/0267510 A1* | 9/2014 | Furuya | B41J 2/1631 |
| | | | 310/317 |
| 2015/0155470 A1* | 6/2015 | Mori | B06B 1/0611 |
| | | | 310/326 |
| 2017/0025595 A1* | 1/2017 | Park | H01L 41/053 |
| 2020/0092647 A1* | 3/2020 | Palmer | H04R 25/407 |

FOREIGN PATENT DOCUMENTS

| JP | 2006-299962 A | 11/2006 |
|---|---|---|
| JP | 2016-051894 A | 4/2016 |

\* cited by examiner

METHOD FOR VIBRATING A VIBRATION DEVICE

BACKGROUND OF THE INVENTION

1. Field of the Invention

The present invention relates to a method for vibrating a vibration device.

2. Description of Related Art

Known vibration devices include a piezoelectric element, a vibration member to which the piezoelectric element is bonded, and a wiring member connected with the piezoelectric element (see, for example, Japanese Unexamined Patent Publication No. 2016-051894).

SUMMARY OF THE INVENTION

An object of one aspect of the present invention is to provide a method for vibrating a vibration device that suppresses a decrease in reliability of the vibration device.

As a result of research and study the present inventors have discovered the following facts.

As the vibration device vibrates, reliability of the vibration device may decrease. For example, a bonding state between a piezoelectric element and a vibration member may deteriorate with vibration of the vibration device. In a case in which the bonding state between the piezoelectric element and the vibration member deteriorates, a displacement of the piezoelectric element is not properly transmitted to the vibration member, and a displacement amount of the vibration device decreases. For example, with the vibration of the vibration device, a connection state between the piezoelectric element and a wiring member may deteriorate. In a case in which the connection state between the piezoelectric element and the wiring member deteriorates, an electrical connection between the piezoelectric element and the wiring member deteriorates, and the piezoelectric element tends not to be properly driven.

The inventors of the present invention have conducted further research and study on a vibration method for suppressing a decrease in the reliability of the vibration device. Consequently, the present inventors have found the following facts and have arrived at the present invention.

Vibrating the vibration device in a predetermined vibration mode suppresses the deterioration of the bonding state between the piezoelectric element and the vibration member and the connection state between the piezoelectric element and the wiring member. The predetermined vibration mode includes a vibration mode that includes a fundamental frequency component lower than a resonance frequency component of the vibration device and does not approximately include a high order frequency component that is n times (n represents an integer of 2 or more) the fundamental frequency component.

One aspect of the present invention includes a method for vibrating a vibration device. The vibration device includes a piezoelectric element, a vibration member to which the piezoelectric element is bonded, and a wiring member connected with the piezoelectric element. The method includes inputting a signal including a fundamental frequency component to the piezoelectric element through the wiring member, and vibrating the vibration device in a vibration mode that includes the fundamental frequency component and does not approximately include a high order frequency component that is n times (n represents an integer of 2 or more) the fundamental frequency component. The fundamental frequency component is lower than the resonance frequency component of the vibration device.

The one aspect suppresses deterioration of a bonding state between the piezoelectric element and the vibration member and a connection state between the piezoelectric element and the wiring member. Therefore, the one aspect suppresses a decrease in reliability of the vibration device.

As a result of research and study, the present inventors have discovered the following facts.

In a case in which the fundamental frequency component is included in a human audible frequency band, a user strongly perceives an operational tactile sensation (for example, click feeling).

In the one aspect, the fundamental frequency component may be included in the human audible frequency band. In this case, a user strongly perceives an operational tactile sensation.

In the one aspect, the vibration device may be mounted in a vehicle. In this case, even in a vehicle including a vibration source other than the vibration device, a user strongly perceives an operational tactile sensation.

In the one aspect, the wiring member may include a base and a plurality of conductors. In this case, the base includes a resin and is bonded to the vibration member. The plurality of conductors is disposed on the base and connected with the piezoelectric element. This configuration suppresses deterioration of a bonding state between the wiring member and the vibration member. Therefore, this configuration further suppresses deterioration of an electrical connection between the piezoelectric element and the wiring member.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
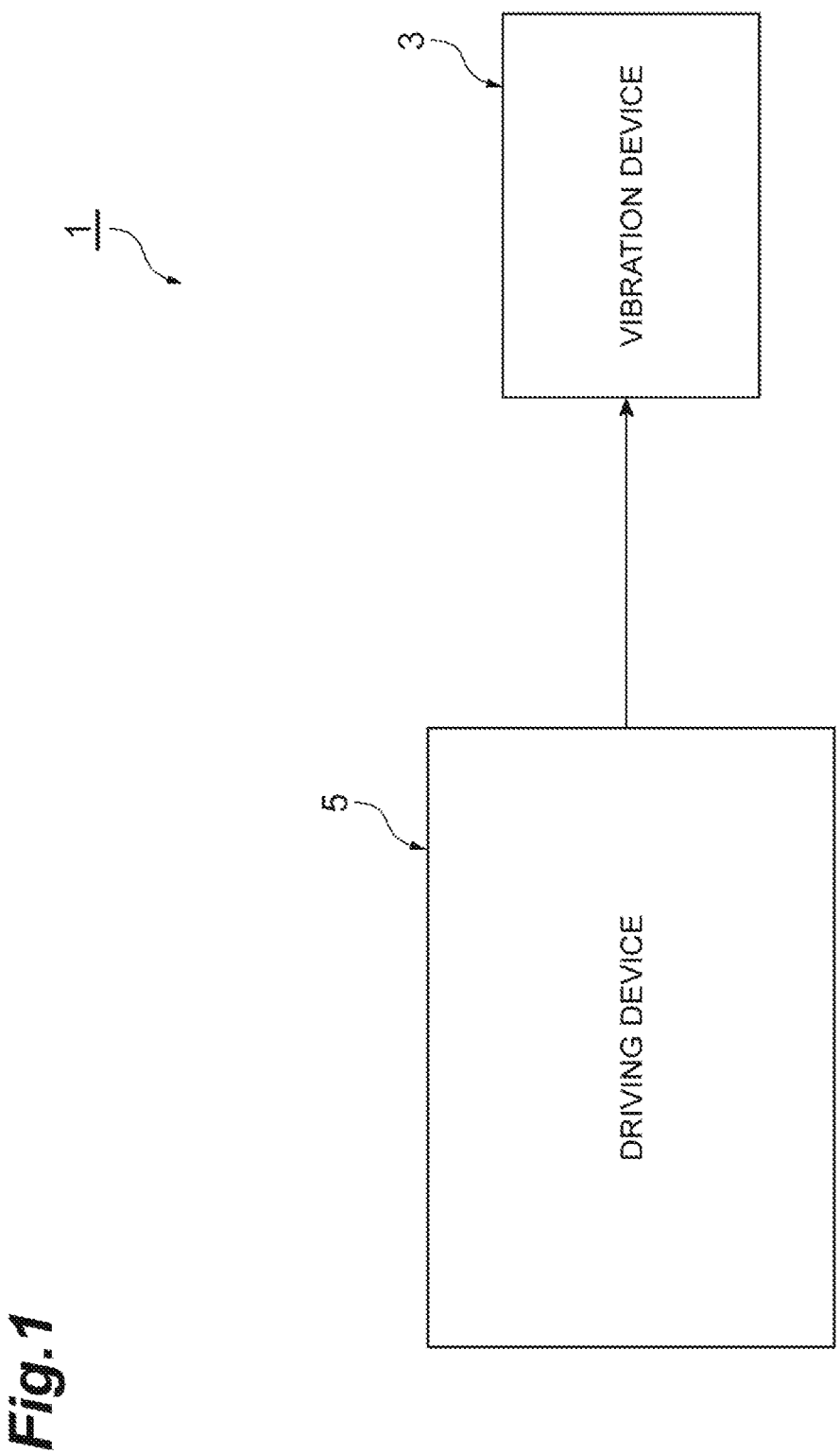
FIG. 1 is a diagram illustrating a tactile sense presentation device according to an embodiment.

Hereinafter, embodiments of the present invention will be described in detail with reference to the accompanying drawings. In the following description, the same elements or elements having the same functions are denoted with the same reference numerals and overlapped explanation is omitted.

As illustrated in FIG. 1, a tactile sense presentation device 1 according to the present embodiment includes a vibration device 3 and a driving device 5.

Figure 2:
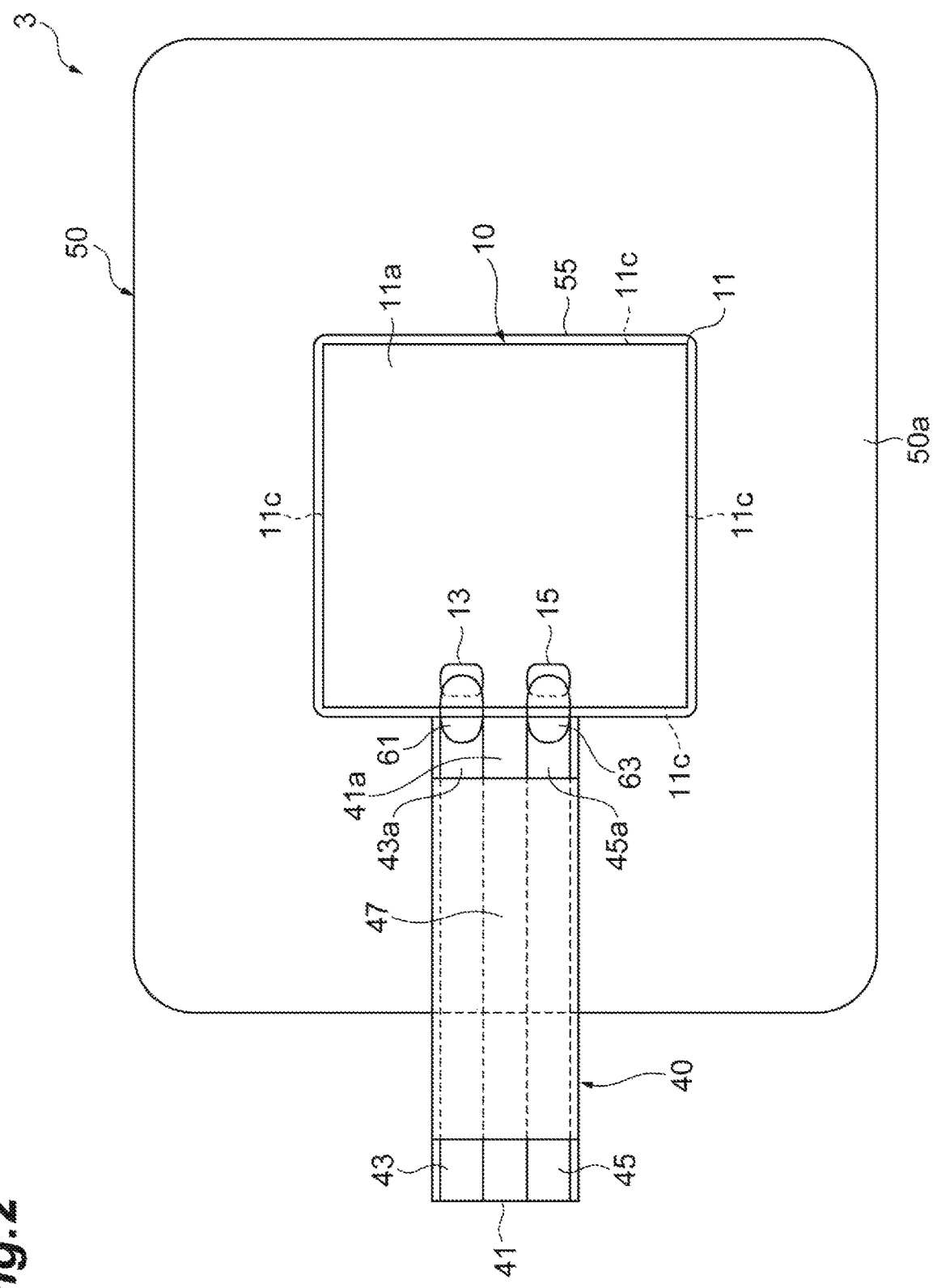
FIG. 2 is a plan view illustrating an example of a vibration device.
Figure 7:
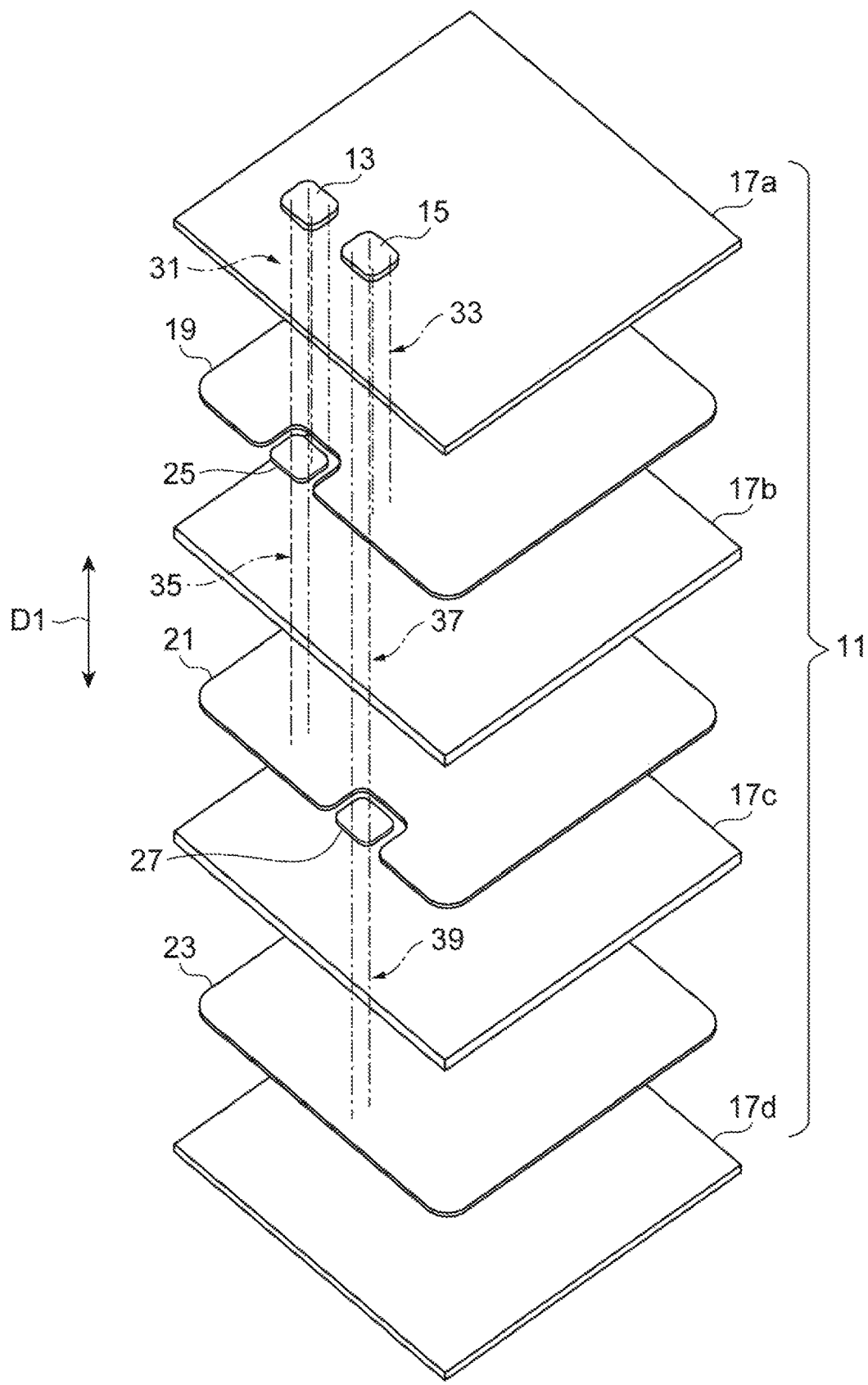
FIG. 7 is an exploded perspective view illustrating a configuration of a piezoelectric element.
Figure 8:
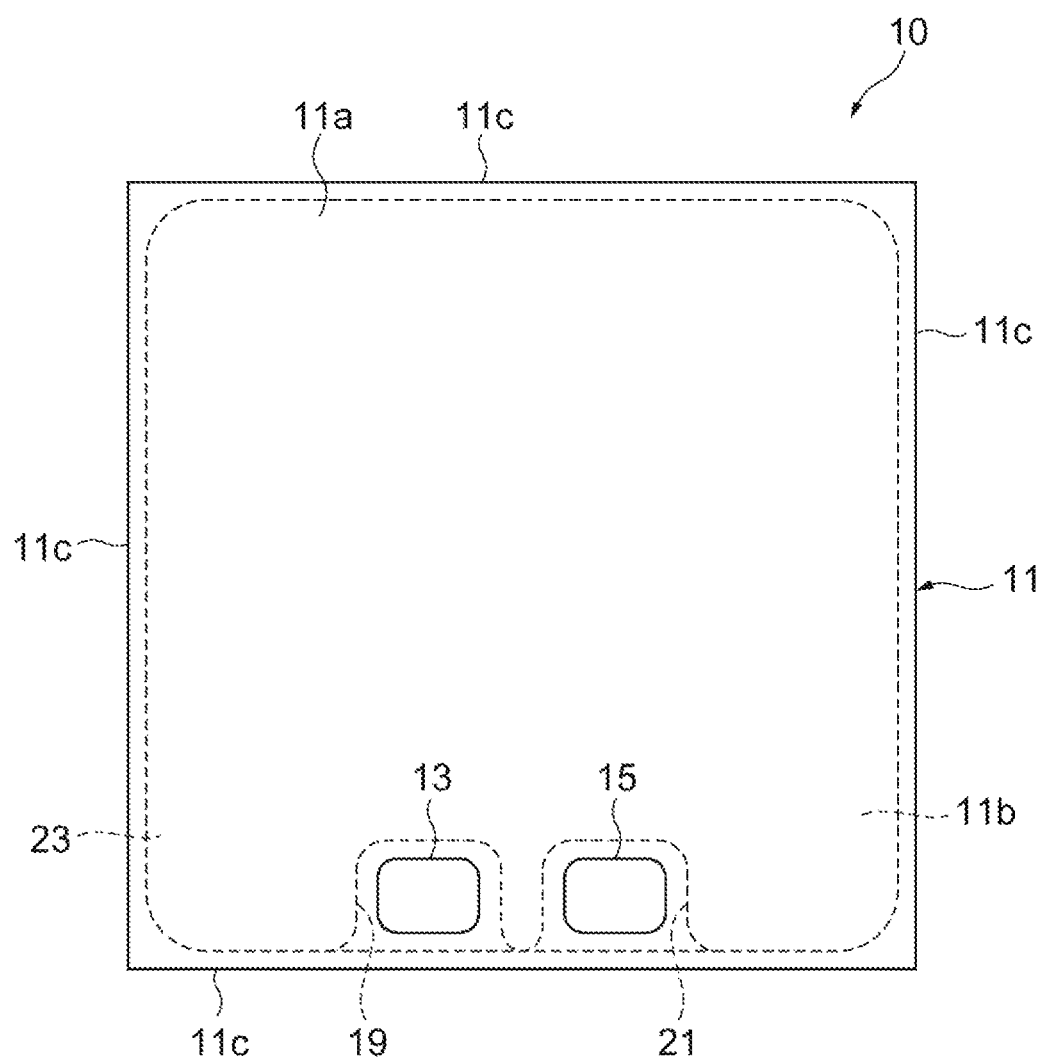
FIG. 8 is a plan view of the piezoelectric element.

First, a configuration of the vibration device 3 will be described with reference to FIGS. 2 to 8. FIG. 2 is a plan view of the vibration device. FIGS. 3, 4, 5, and 6 are views illustrating cross-sectional configurations of the vibration device. FIG. 7 is an exploded perspective view illustrating a configuration of a piezoelectric element. FIG. 8 is a plan view of the piezoelectric element. A disclosure according to the present embodiment includes a method for vibrating the vibration device 3.

For Example, in a case in which an element is described as opposing another element, the element may directly oppose the other element or indirectly oppose the other element. In a case in which an element indirectly opposes another element, an intervening element is present between the element and the other element. In a case in which an element directly opposes another element, no intervening element is present between the element and the other element.

For Example, in a case in which an element is described as being disposed on another element, the element may be directly disposed on the other element or be indirectly disposed on the other element. In a case in which an element is indirectly disposed on another element, an intervening element is present between the element and the other element. In a case in which an element is directly disposed on another element, no intervening element is present between the element and the other element.

For Example, in a case in which an element is described as covering another element, the element may directly cover the other element or indirectly cover the other element. In a case in which an element indirectly covers another element, an intervening element is present between the element and the other element. In a case in which an element directly covers another element, no intervening element is present between the element and the other element.

As illustrated in FIG. 2, the vibration device 3 includes a piezoelectric element 10, a wiring member 40, and a vibration member 50. The piezoelectric element 10 includes a piezoelectric element body 11 and a plurality of external electrodes 13 and 15. In the present embodiment, the piezoelectric element 10 includes the two external electrodes 13 and 15.

The piezoelectric element body 11 has a rectangular parallelepiped shape. The piezoelectric element body 11 includes a pair of principal surfaces 11a and 11b opposing each other and four side surfaces 11c. The rectangular parallelepiped shape includes a rectangular parallelepiped shape with chamfered corner portions and ridge portions, and a rectangular parallelepiped shape with rounded corner portions and ridge portions. The principal surfaces 11a and 11b have a rectangular shape. In the present embodiment, the principal surfaces 11a and 11b have a square shape. The length of a side edge of each principal surface 11a and 11b is, for example, 30 mm. The square shape includes a square shape with chamfered corners, and a square shape with rounded corners.

The direction in which the pair of principal surfaces 11a and 11b opposes is a first direction D1. The first direction D1 is a direction orthogonal to the principal surfaces 11a and 11b. The four side surfaces 11c extend in the first direction D1 in such a manner as to couple the pair of principal surfaces 11a and 11b. The principal surfaces 11a and 11b and the side surfaces 11c may be indirectly adjacent to each other. In this case, a ridge portion is located between each of the principal surfaces 11a and 11b and each of the side surfaces 11c. The length of the piezoelectric element body 11 in the first direction D1 (thickness of the piezoelectric element body 11) is, for example, 100 µm.

As illustrated in FIG. 7, the piezoelectric element body 11 is configured by laminating a plurality of piezoelectric layers 17a, 17b, 17c, and 17d in the first direction D1. The piezoelectric element body 11 includes the plurality of laminated piezoelectric layers 17a, 17b, 17c, and 17d. In the present embodiment, the piezoelectric element body 11 includes the four piezoelectric layers 17a, 17b, 17c, and 17d. In the piezoelectric element body 11, the direction in which the plurality of piezoelectric layers 17a, 17b, 17c, and 17d is laminated accords with the first direction D1.

Each of the piezoelectric layers 17a, 17b, 17c, and 17d contains a piezoelectric material. In the present embodiment, each of the piezoelectric layers 17a, 17b, 17c, and 17d contains a piezoelectric ceramic material. Examples of the piezoelectric ceramic material include PZT[Pb(Zr, Ti)O$_3$], PT(PbTiO$_3$), PLZT[(Pb, La)(Zr, Ti)O$_3$], and barium titanate (BaTiO$_3$). Each of the piezoelectric layers 17a, 17b, 17c, and 17d is composed of a sintered body of a ceramic green sheet containing the above-described piezoelectric ceramic material, for example. In the actual piezoelectric element body 11, the piezoelectric layers 17a, 17b, 17c, and 17d are integrated to such an extent that boundaries between each two of the piezoelectric layers 17a, 17b, 17c and 17d cannot be recognized.

The piezoelectric layer 17a includes the principal surface 11a. The piezoelectric layer 17d includes the principal surface 11b. The piezoelectric layers 17b and 17c are located between the piezoelectric layer 17a and the piezoelectric layer 17d. The thickness of the piezoelectric layer 17a or 17d is smaller than the thickness of the piezoelectric layer 17b or 17c. The thickness of the piezoelectric layer 17a or 17d is, for example, 33 μm. The thickness of the piezoelectric layer 17b or 17c is, for example, 16 μm. The thickness of each piezoelectric layers 17a, 17b, 17c, and 17d may be equivalent.

As illustrated in FIGS. 3, 4, 5, and 7, the piezoelectric element 10 includes a plurality of internal electrodes 19, 21, and 23 disposed in the piezoelectric element body 11. In the present embodiment, the piezoelectric element 10 includes the three internal electrodes 19, 21, and 23. Each of the internal electrodes 19, 21, and 23 contain a conductive material. As the conductive material, Ag, Pd, or an Ag—Pd alloy is used, for example. Each of the internal electrodes 19, 21, and 23 is composed as a sintered body of a conductive paste containing the above-described conductive material. Each of the internal electrodes 19, 21, and 23 has an approximately rectangular shape (for example, approximately square shape).

The internal electrodes 19, 21, and 23 are disposed at different positions (layers) in the first direction D1. The internal electrode 19 and the internal electrode 21 oppose each other with a space in the first direction D1. The internal electrode 21 and the internal electrode 23 oppose each other with a space in the first direction D1. The internal electrode 19 is located between the piezoelectric layer 17a and the piezoelectric layer 17b. The internal electrode 21 is located between the piezoelectric layer 17b and the piezoelectric layer 17c. The internal electrode 23 is located between the piezoelectric layer 17c and the piezoelectric layer 17d. The internal electrodes 19, and 23 are not exposed to a surface of the piezoelectric element body 11. That is, the internal electrodes 19, 21, and 23 are not exposed to the side surface 11c. As illustrated in FIG. 8, each of the internal electrodes 19, 21, and 23 is separated from all of edges (four side edges) of each of the principal surfaces 11a and 11b as viewed from the first direction D1.

The plurality of external electrodes 13 and 15 is disposed on the principal surface 11a. The external electrodes 13 and 15 are disposed along only one side edge of the principal surface 11a. The external electrode 13 and the external electrode 15 are adjacent to each other. As illustrated in FIG. 8, each of the external electrodes 13 and 15 is separated from all of edges (four side edges) of the principal surface 11a or 11b as viewed from the first direction D1. Each of the external electrodes 13 and 15 is separated from all of edges (four side edges) of the internal electrode 19, 21, or 23 as viewed from the first direction D1. Each of the external electrode 13 and 15 contains a conductive material. As the conductive material, Ag, Pd, or an Ag—Pd alloy is used, for example. Each of the external electrodes 13 and 15 is composed as a sintered body of a conductive paste containing the above conductive material.

The external electrode 13 is electrically connected with a connection conductor 25 through a plurality of via conductors 31. The connection conductor 25 is located in the same layer as the internal electrode 19. The connection conductor 25 is located between the piezoelectric layer 17a and the piezoelectric layer 17b. The internal electrode 19 and the connection conductor 25 are separated from each other. The connection conductor 25 opposes the external electrode 13 in the first direction D1. The plurality of via conductors 31 is connected with the external electrode 13, and is connected with the connection conductor 25. The connection conductor 25 is electrically connected with the internal electrode 21 through a plurality of via conductors 35. The connection conductor 25 opposes the internal electrode 21 in the first direction D1. The plurality of via conductors 35 is connected with the connection conductor 25, and is connected with the internal electrode 21.

The external electrode 15 is electrically connected with the internal electrode 19 through a plurality of via conductors 33. The internal electrode 19 opposes the external electrode 15 in the first direction D1. The plurality of via conductors 33 is connected with the external electrode 15, and is connected with the internal electrode 19. The internal electrode 19 is electrically connected with a connection conductor 27 through a plurality of via conductors 37.

The connection conductor 27 is located in the same layer as the internal electrode 21. The connection conductor 27 is located between the piezoelectric layer 17b and the piezoelectric layer 17c. The internal electrode 21 and the connection conductor 27 are separated from each other. The connection conductor 27 opposes the internal electrode 19 in the first direction D1. The plurality of via conductors 37 is connected with the internal electrode 19, and is connected with the connection conductor 27. The connection conductor 27 is electrically connected with the internal electrode 23 through a plurality of via conductors 39. The connection conductor 27 opposes the internal electrode 23 in the first direction D1. The plurality of via conductors 39 is connected with the connection conductor 27, and is connected with the internal electrode 23.

The external electrode 13 is electrically connected with the internal electrode 21 through the plurality of via conductors 31, the connection conductor 25, and the plurality of via conductors 35. The external electrode 15 is electrically connected with the internal electrode 19 through the plurality of via conductors 33. The external electrode 15 is electrically connected with the internal electrode 23 through the plurality of via conductors 33, the internal electrode 19, the plurality of via conductors 37, the connection conductor 27, and the plurality of via conductors 39. A region in the piezoelectric layer 17b, the region being sandwiched between the internal electrode 19 and the internal electrode 21, and a region in the piezoelectric layer 17c, the region being sandwiched between the internal electrode 21 and the internal electrode 23 constitute piezoelectric active regions.

Each of the connection conductors 25 and 27 and the via conductors 31, 33, 35, 37, and 39 contain a conductive material. As the conductive material, Ag, Pd, or an. Ag—Pd alloy is used, for example. Each of the connection conductors 25 and 27 and the via conductors 31, 33, 35, 37, and 39 is composed as a sintered body of a conductive paste containing the above conductive material. Each of the connection conductors 25 and 27 has an approximately rectangular shape. The via conductors 31, 33, 35, 37, and 39 are formed by sintering the conductive paste filled in throughholes formed in the ceramic green sheets for forming the corresponding piezoelectric layers 17a, 17b, and 17c.

Conductors electrically connected with the internal electrodes 19 and 23 and conductors electrically connected with the internal electrode 21 are not disposed on the principal surface 11b of the piezoelectric element body 11. In the present embodiment, when the principal surface 11b is viewed from the first direction D1, the entire principal surface 11b is exposed. The principal surfaces 11a and 11b are natural surfaces. The natural surface is a surface constituted by a surface of crystal grains grown by firing. Conductors electrically connected with the internal electrodes 19 and 23 and conductors electrically connected with the internal electrode 21 are not disposed on each of the side surfaces 11c of the piezoelectric element body 11. In, the present embodiment, when each of the side surfaces lie is viewed from a direction orthogonal to the side surface 11c, the entire side surface 11c is exposed. In the present embodiment, the side surfaces 11c are natural surfaces.

Figure 6:
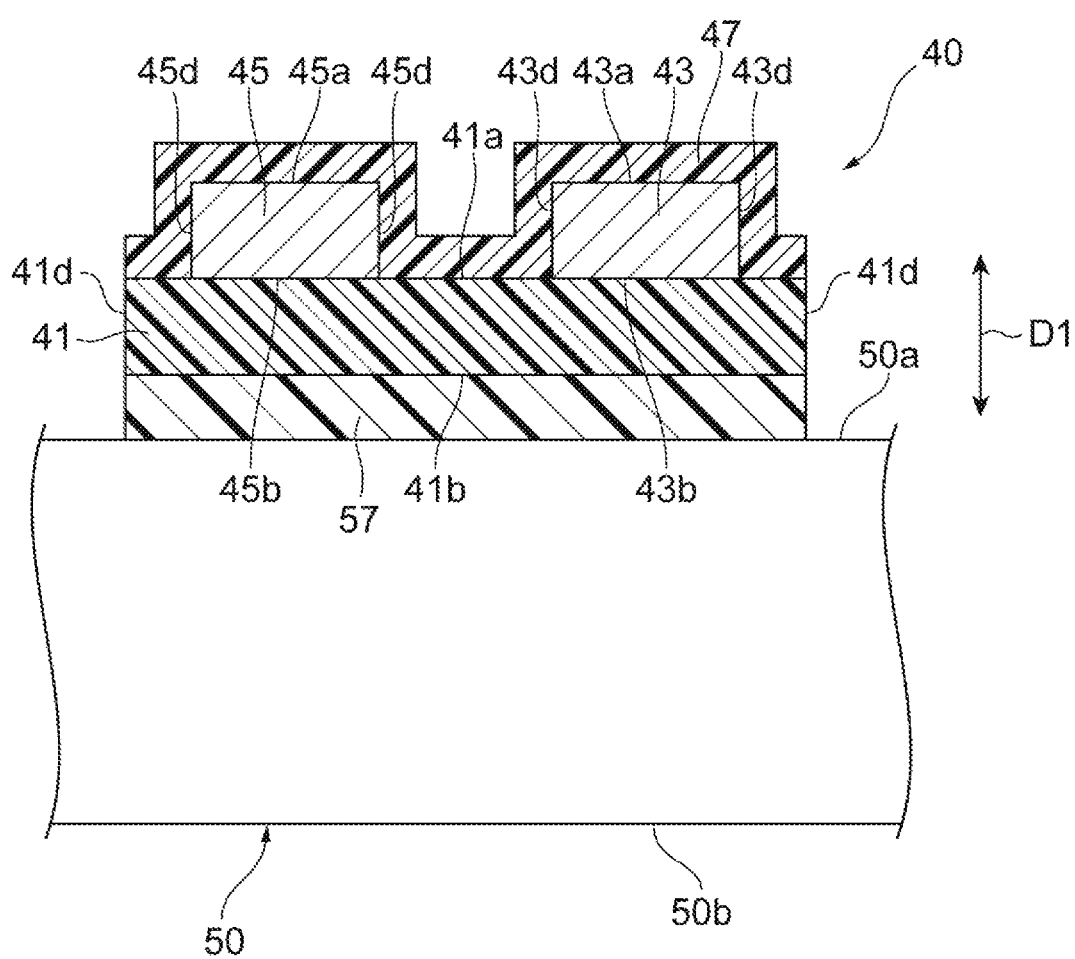
FIG. 6 is a view illustrating a cross-sectional configuration of the vibration device.

As illustrated in FIG. 6, the wiring member 40 includes a base 41, a plurality of conductors 43 and 45, and a cover 47. In the present embodiment, the wiring member 40 includes the pair of conductors 43 and 45. The wiring member 40 is, for example, a flexible printed circuit board (FPC). The wiring member 40 extends in a predetermined direction. The wiring member 40 extends, for example, in a direction crossing the side edge of the element body 11 (principal surfaces 11a and 11b) as viewed from the first direction D1. In the present embodiment, the wiring member 40 extends in a direction orthogonal to the side edge of the element body 11 (principal surfaces 11a and 11b) as viewed from the first direction D1. The wiring member 40 may include a wiring board.

The base 41 includes a pair of principal surfaces 41a and 41b opposing each other, an end surface 41c, and a pair of side surfaces 41c opposing each other. The base 41 has electrical insulation properties. The base 41 contains, for example, a polyimide resin. The end surface 41c extends in the first direction D1 in such a manner as to couple the pair of principal surfaces 41a and 41b. The end surface 41c is opposes one side surface 11c. The pair of side surfaces 41d extends in the first direction D1 in such a manner as to couple the pair of principal surfaces 41a and 41b. The pair of side surfaces 41d extends along the predetermined direction. In the present embodiment, the principal surface 41b is entirely exposed when the principal surface 41b is viewed from a direction in which the principal surface 41a and the principal surface 41b oppose each other. The base 41 may include a resin film.

The pair of conductors 43 and 45 is disposed on the base 41 (principal surface 41a). The pair of conductors 43 and 45 is bonded to the base 41 by an adhesive layer (not illustrated). The conductors 43 and 45 extend in the predetermined direction. The conductors 43 and 45 are separated from each other in a direction intersecting with a direction in which the conductor 43 and 45 extend. Each of the conductors 43 and 45 contains, for example, copper.

The conductor 43 includes a pair of principal surfaces 43a and 43b opposing each other, an end surface 43c, and a pair of side surfaces 43d opposing each other. The principal surface 43b is in contact with the principal surface 41a. The end surface 43c extends in the first direction D1 in such a manner as to couple the pair of principal surfaces 43a and 43b. The end surface 43c opposes one side surface 11c. The pair of side surfaces 43d extends in the first direction D1 in such a manner as to couple the pair of principal surfaces 43a and 43b. The pair of side surfaces 43d extends along the predetermined direction. In the present embodiment, the end surface 41c and the end surface 43c are located on approximately the same plane.

The conductor 45 has a pair of principal surfaces 45a and 45b opposing each other, an end surface 45c, and a pair of side surfaces 45d opposing each other. The principal surface 45b is in contact with the principal surface 41a. The end surface 45c extends along the first direction D1 in such a manner as to couple the pair of principal surfaces 45a and 45b. The end surface 45c opposes one side surface 11c. The pair of side surfaces 45d extends in the first direction D1 in such a manner as to couple the pair of principal surfaces 45a and 45b. The pair of side surfaces 45d extends along the predetermined direction. The side surface 43d and the side surface 45d oppose each other. In the present embodiment, the end surface 41c and the end surface 45c are located on approximately the same plane.

The cover 47 is disposed on the conductors 43 and 45 in such a manner as to cover a part of the conductors 43 and 45. The conductors 43 and 45 are exposed from the cover 47 at one end portion and another end portion of the wiring member 40. The cover 47 is also disposed on the principal surface 41a in such a manner as to cover a region exposed from the conductors 43 and 45 in the principal surface 41a. Both end portions of the base 41 in the predetermined direction are exposed from the cover 47. The cover 47 is bonded to the conductors 43 and 45 by an adhesive layer (not illustrated).

The base 41 is exposed from the cover 47 at the one end portion and the other end portion of the wiring member 40. The base 41 and the cover 47 are bonded to each other in a region exposed from the conductors 43 and 45. The cover 47 contains a resin. The cover 47 contains, for example, a polyimide resin. For example, gold flash plating is applied to regions of the conductors 43 and 45 exposed from the cover 47. The cover 47 may include a coating film.

The length of the wiring member 40 (thickness of the wiring member 40) in the direction in which the principal surfaces 41a and 41b oppose (first direction D1) is defined with a total of the length of the base 41 (thickness of the base 41) in the direction in which the principal surfaces 41a and 41b oppose, the length of the conductor 43 or 45 (thickness of the conductor 43 or 45) in the direction in which the principal surfaces 41a and 41b oppose, and the length of the cover 47 (thickness of the cover 47) in the direction in which the principal surfaces 41a and 41b oppose. In the present embodiment, the thickness of the wiring member 40 is, for example, 70 μm. The thickness of the base 41 is, for example, 20 μm. The thickness of each of the conductors 43 and 45 is, for example, 20 μm. The thickness of the base 41 and the thickness of each of the conductors 43 and 45 may be different from each other.

The vibration member 50 includes principal surfaces 50a and 50b opposing each other. In the present embodiment, the vibration member 50 is a plate-like member. The vibration member 50 contains, for example, a metal. The vibration member 50 contains, for example, a Ni—Fe alloy, Ni, brass, or stainless steel. The vibration member 50 (principal surfaces 50a and 50b) has a rectangular shape as viewed from a direction in which the principal surface 50a and the principal surface 50b oppose. The rectangular shape also includes a rectangular shape with chamfered corners, and a rectangular shape with rounded corners. The vibration member 50 may include a, vibrating plate or a diaphragm.

Each of the principal surfaces 50a and 50b includes a pair of long-side edges and a pair of short-side edges. Each of the principal surfaces 50a and 50b has a rectangular shape having the pair of long-side edges and the pair of short-side edges. That is, the vibration member 50 has the rectangular shape having the pair of long-side edges and the pair of short-side edges. The length of the vibration member 50 in the long-side edge direction is, for example, 80 mm. The length of the vibration member 50 in the short-side edge direction is, for example, 60 mm. The length of the vibration member 50 in the direction in which the principal surface 50a and the principal surface 50b oppose (thickness of the vibration member 50) is, for example, 250 μm.

The piezoelectric element 10 and the wiring member 40 are bonded to the vibration member 50. The principal surface 11b of the piezoelectric element body 11 and the principal surface 50a of the vibration member 50 oppose each other. The principal surface 41b of the base 41 and the principal surface 50a of the vibration member 50 oppose each other. That is, the principal surface 11b and the principal surface 50a are bonded to each other. The principal surface 41b and the principal surface 50a are bonded to each other. In a state in which the piezoelectric element 10 and the wiring member 40 are bonded to the vibration member 50, the first direction D1, the direction in which the principal surface 41a and the principal surface 41b oppose, the direction in which the principal surface 50a and the principal surface 50b oppose are approximately the same. The piezoelectric element 10 is disposed in a central portion of the vibration member 50 as viewed from the first direction D1.

The piezoelectric, element 10 is bonded to the vibration member 50 with the principal surface 11b and the four side surfaces 11c by a bonding member 55. The bonding member 55 is a member for bonding the piezoelectric element 10 and the vibration member 50. The piezoelectric element 10 is bonded to the principal surface 50a with the principal surface 11b and the side surfaces 11c by the bonding member 55. In the present embodiment, the principal surface 11b and the four side surfaces 11c are entirely covered with the bonding member 55. That is, the principal surface 11b and the four side surfaces 11c are entirely in contact with the bonding member 55. The principal surface 11a is not covered with the bonding member 55 and is exposed from the bonding member 55. The principal surface 11b and the principal surface 50a are indirectly oppose each other with the bonding member 55 therebetween.

The wiring member 40 is bonded to the vibration member 50 with the principal surface 41b of the base 41 by a bonding member 57. That is, the base 41 is bonded to the vibration member 50. The bonding member 57 is a member for bonding the wiring member 40 and the vibration member 50. The wiring member 40 is bonded to the principal surface 50a by the bonding member 57. In the present embodiment, the entire region of the principal surface 41b, the region being located on the vibration member 50, is covered with the bonding member 57. That is, the entire region of the principal surface 41b is in contact with the bonding member 57. The pair of side surfaces 41d is not covered with the bonding member 57 and is exposed from the bonding member 57. The pair of side surfaces 41d is not covered with the bonding member 55 and is exposed from the bonding member 55. The principal surface 41b and the principal surface 50a are indirectly oppose each other with the bonding member 57 therebetween.

The end surface 41c of the base 41 and the end surfaces 43a and 45a of the pair of conductors 43 and 45 are not covered with the bonding member 57 and are exposed from the bonding member 57. The end surfaces 41c, 43c, and 45c are covered with the bonding member 55 and are in contact with the bonding member 55. In the present embodiment, the entire end surfaces 41c, 43c, and 45c are in contact with the bonding member 55. That is, the entire end surfaces 41c, 43c, and 45c are bonded to the vibration member 50 by the bonding member 55.

As the bonding members 55 and 57, for example, a resin (an epoxy resin, an acrylic resin, or the like) is used. The bonding members 55 and 57 contain no conductive filler and have electrical insulation properties. The bonding members 55 and 57 may be made of different resins or may be made of the same resin.

The piezoelectric element 10 and the wiring member 40 are adjacent to each other on the vibration member 50. The wiring member 40 is adjacent to the one side edge of the principal surface 11a along which the two external electrodes 13 and 15 are disposed as viewed from the first direction D1. The piezoelectric element 10 and the wiring member 40 are separated from each other as viewed from the first direction D1. The distance between the piezoelectric element 10 and the wiring member 40 is, for example, greater than 0 mm and less than or equal to 1 mm.

The direction in which the conductors 43 and 45 extend, that is, the predetermined direction, and the one side edge along which the two external electrodes 13 and 15 are disposed intersect with each other, as viewed from the first direction D1. In the present embodiment, the direction in which the conductors 43 and 45 extend and the one side edge along which the two external electrodes 13 and 15 are disposed are approximately orthogonal to each other.

Figure 3:
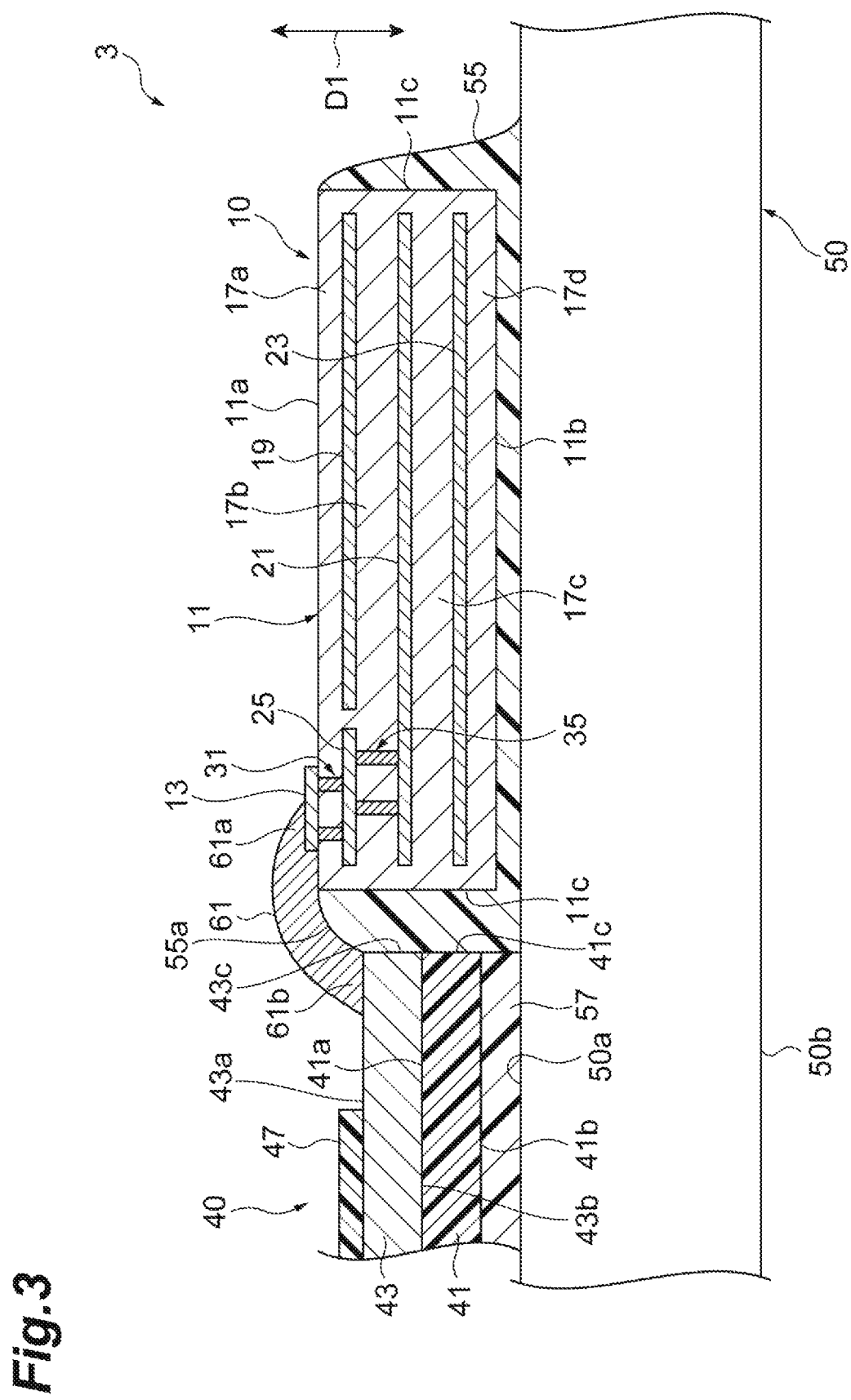
FIG. 3 is a view illustrating a cross-sectional configuration of the vibration device.
Figure 4:
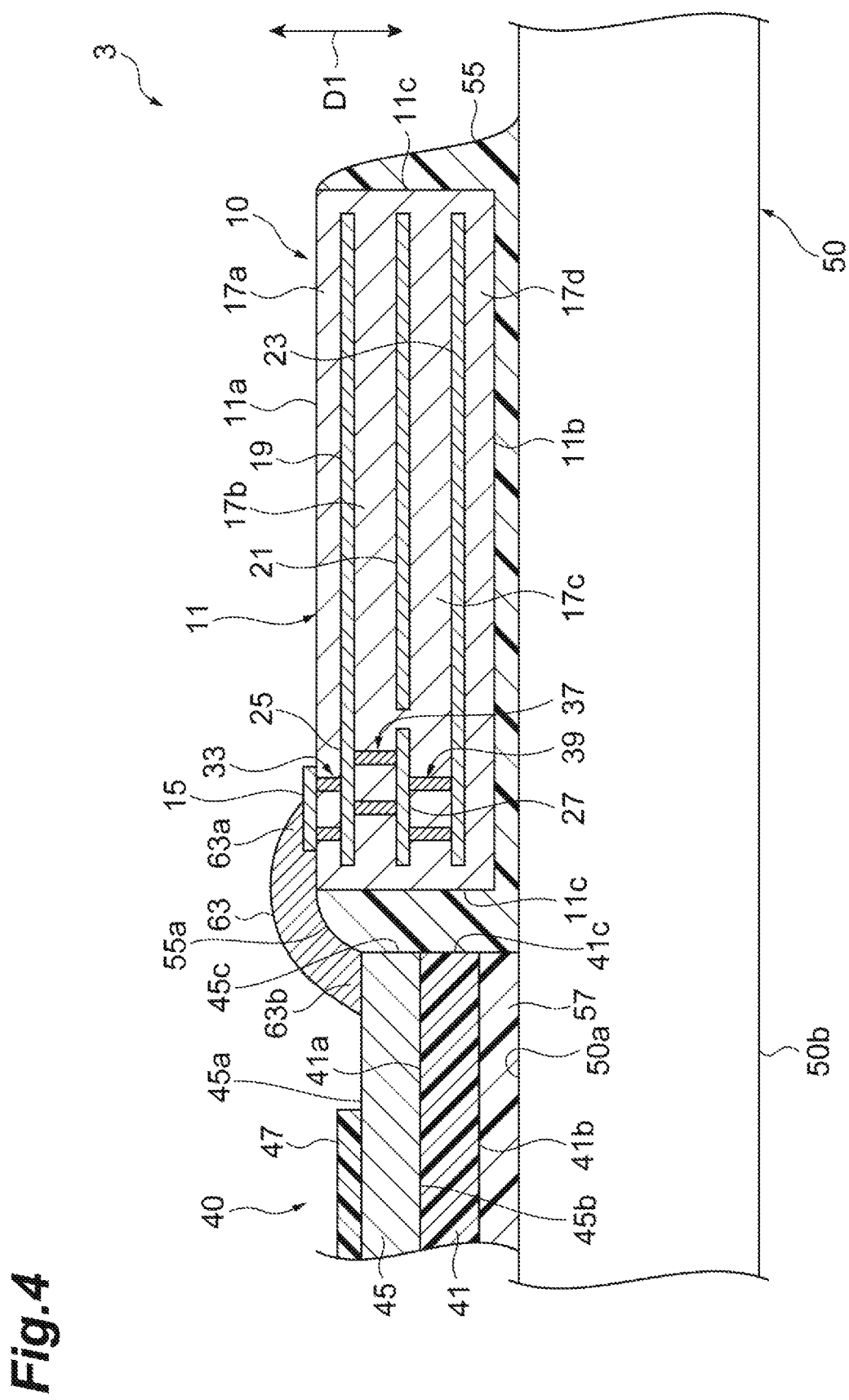
FIG. 4 is a view illustrating a cross-sectional configuration of the vibration device.
Figure 5:
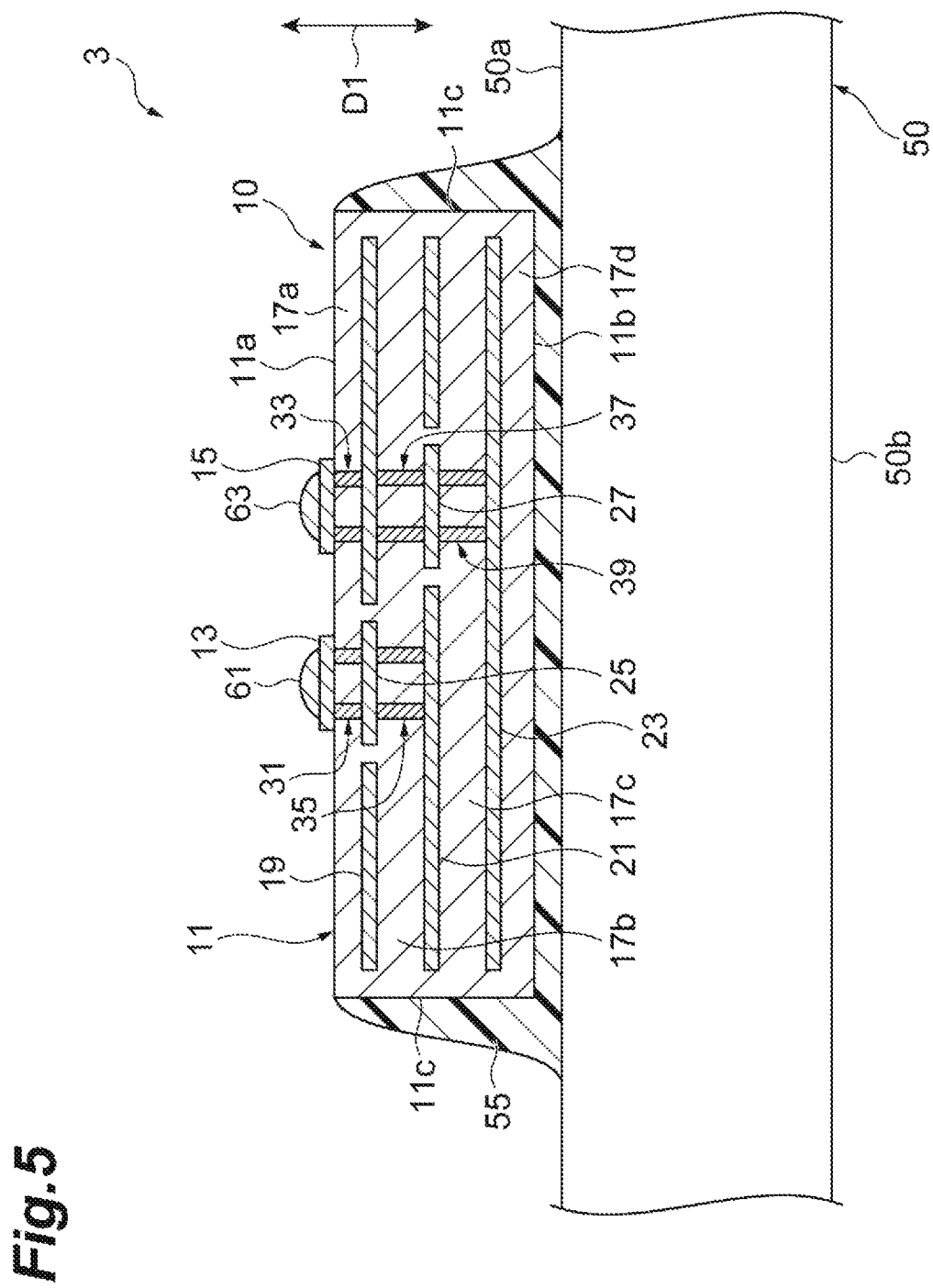
FIG. 5 is a view illustrating a cross-sectional configuration of the vibration device.

As illustrated in FIGS. 3 and 4, a height position (hereinafter referred to as "first height position") of the principal surfaces 43a and 45a of the pair of conductors 43 and 45 from the vibration member 50 (principal surface 50a) and a height position (hereinafter referred to as "second height position") of the external electrodes 13 and 15 from the vibration member 50 (principal surface 50a) are different from each other. In the present embodiment, the first height position is lower than the second height position. In the present embodiment, the entire end surfaces 41c, 43c, and 45c indirectly oppose the one side surface 11c with the bonding member 55 therebetween.

The bonding member 55 exists between each end surface 41c, 43c, and 45c and the side surface 11c that oppose each other. A surface 55a of the bonding member 55 extends in such a manner as to couple the principal surface 11a and the principal surface 43a, and to couple the principal surface 11a and the principal surface 45a. The surface 55a is inclined from the principal surface 11a toward the principal surfaces 43a and 45a in accordance with the difference between the first height position and the second height position.

As illustrated in FIGS. 2 to 4, the vibration device 3 includes connecting members 61 and 63. The connecting member 61 connects the external electrode 13 and the conductor 43. The external electrode 13 and the conductor 43 are electrically connected to each other via the connecting member 61. The connecting member 63 connects the external electrode 15 and the conductor 45. The external electrode 15 and the conductor 45 are electrically connected to each other via the connecting member 63. The wiring member 40 is connected with the piezoelectric element 10.

The connecting member 61 includes one end portion 61a connected with the external electrode 13 and another end portion 61b connected with the conductor 43 (principal surface 43a). The other end portion 61b is connected with one end portion of the conductor 43, the one end portion being exposed from the cover 47. The other end portion 61b is in contact with the principal surface 43a. The conductor 43 is electrically connected with the internal electrode 21 through the connecting member 61, the external electrode 13, the plurality of via conductors 31, the connection conductor 25, and the plurality of via conductors 35. The connecting member 61 is disposed on the bonding member 55 in such a manner as to be in contact with the external electrode 13 and the one end portion (principal surface 43a)

of the conductor 43. The connecting member 61 is in contact with the bonding member 55.

The connecting member 63 includes one end portion 63a connected with the external electrode 15 and another end portion 63b connected with the conductor 45 (principal surface 45a). The other end portion 63b is connected with one end portion of the conductor 45, the one end portion being exposed from the cover 47. The other end portion 63b is in contact with the principal surface 45a. The conductor 45 is electrically connected with the internal electrode 19 through the connecting member 63, the external electrode 15, the plurality of via conductors 33. The conductor 45 is further electrically connected to the internal electrode 23 through the plurality of via conductors 37, the connection member 27, and the plurality of via conductors 37. The connecting member 63 is disposed on the bonding member 55 in such a manner as to be in contact with the external electrode 15 and the one end portion (principal surface 45a) of the conductor 45. The connecting member 63 is in contact with the bonding member 55.

Each of the connecting members 61 and 63 contains a conductive resin. The conductive resin layer contains a resin (for example, a thermosetting resin) and a conductive material (for example, metal powder). As the metal powder, for example, Ag powder is used. As the thermosetting resin, a phenol resin, an acrylic resin, a silicone resin, an epoxy resin, or a polyimide resin is used, for example. The hardness of the connecting members 61 and 63 is smaller than the hardness of the bonding member 55.

When voltages having different polarities are applied to the external electrode 13 and the external electrode 15 through the conductors 43 and 45, an electric field occurs between the internal electrode 21 and the internal electrode 19, and an electric field occurs between the internal electrode 21 and the internal electrode 23. Displacement occurs in the region in the piezoelectric layer 17b, region being sandwiched between the internal electrode 19 and the internal electrode 21, and in the region in the piezoelectric layer 17c, the region being sandwiched between the internal electrode 21 and the internal electrode 23. When an AC voltage is applied to the external electrodes 13 and 15, the piezoelectric element 10 repeats expansion and contraction in accordance with the frequency of the applied AC voltage. The piezoelectric element 10 and the vibration member 50 are bonded to each other. Therefore, the vibration member 50 performs flexural vibration integrally with the piezoelectric element 10 in accordance with the repetition of expansion and contraction in the piezoelectric element 10.

Figure 9:
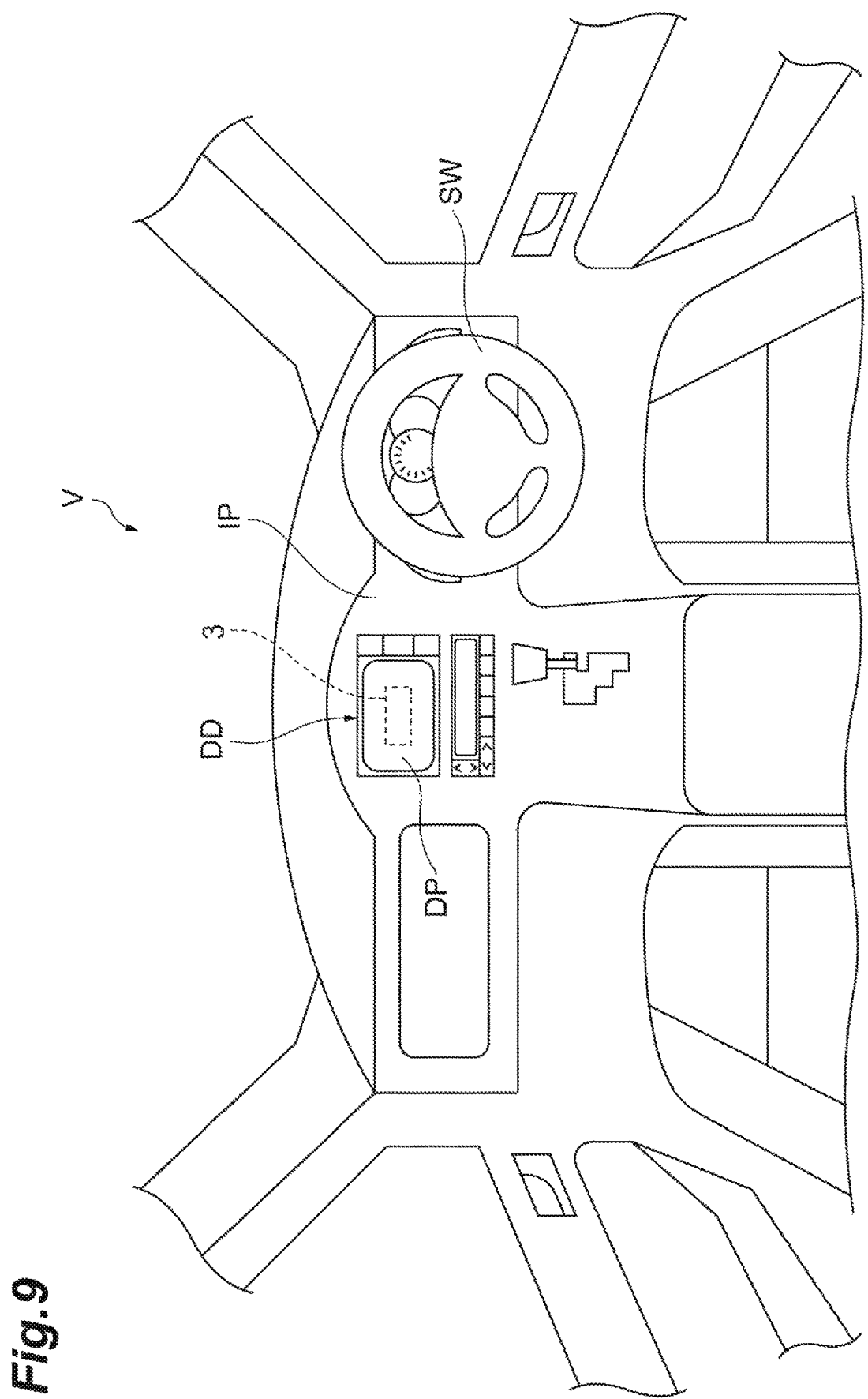
FIG. 9 is a schematic view illustrating an example of a disposition of the vibration device.
Figure 10:
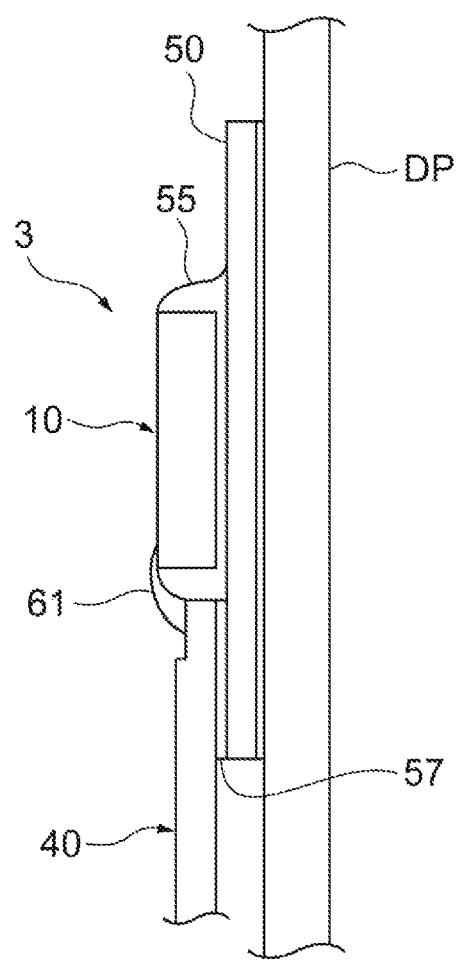
FIG. 10 is a schematic view illustrating an example of the disposition of the vibration device.

As illustrated in FIGS. 9 and 10, the vibration device 3 is mounted on, for example, a vehicle V. The vibration device 3 is disposed in a display device DD disposed on an instrument panel IP of the vehicle V. The vibration device 3 is bonded, for example, to the back surface of a display panel DP of the display device DD. The vibration device 3 may be disposed, for example, in a steering wheel SW. FIG. 9 is a schematic view illustrating an example of a disposition of the vibration device. FIG. 10 is a schematic view illustrating an example of the disposition of the vibration device.

Figure 11:
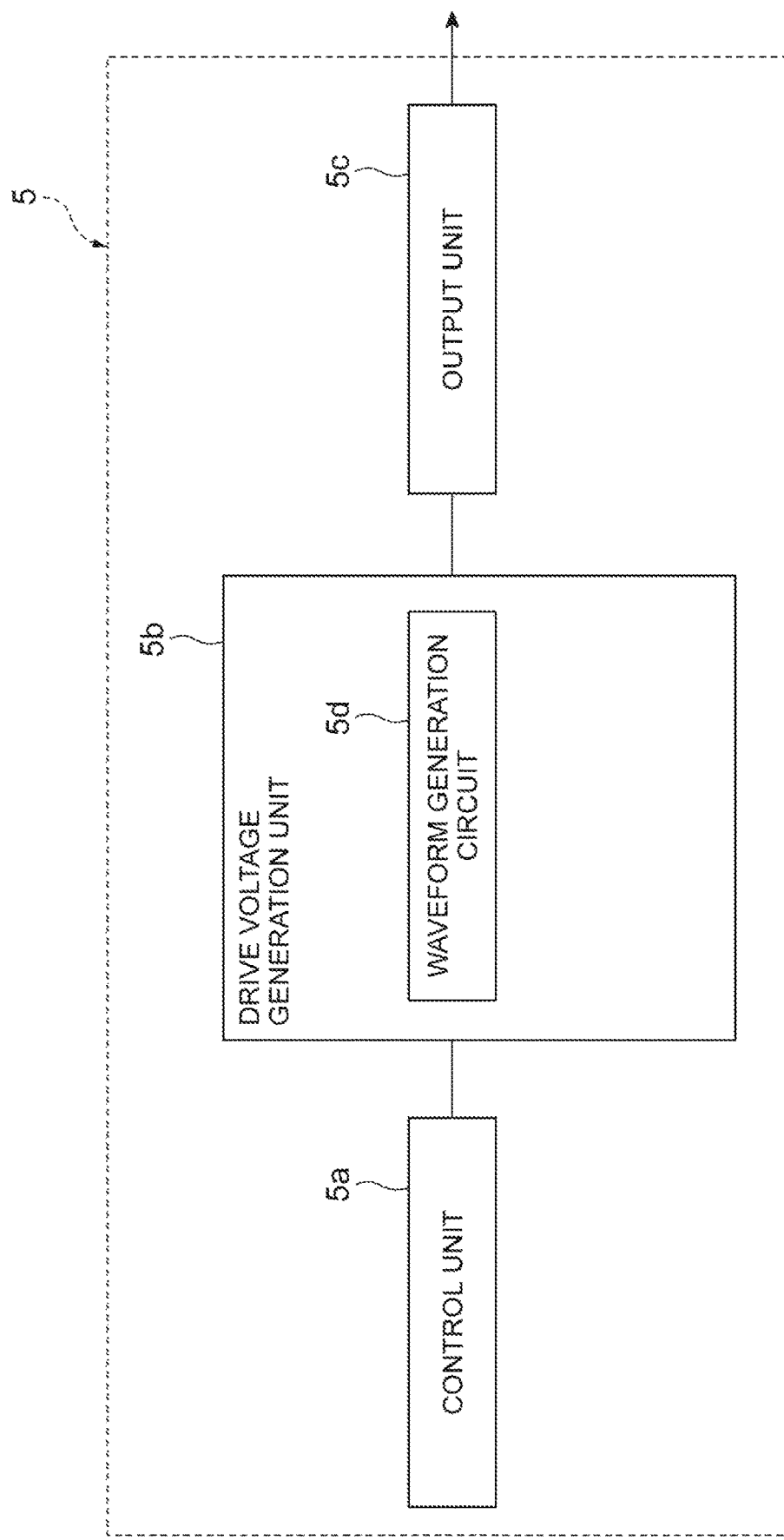
FIG. 11 is a block diagram illustrating a configuration of a driving device.

Next, a configuration of the driving device 5 will be described with reference to FIG. 11. The driving device 5 includes a control unit 5a, a drive voltage generation unit 5b, and an output unit 5c. The driving device 5 outputs a signal (driving signal) to the vibration device 3 to drive the vibration device 3 (piezoelectric element 10). The control unit 5a includes, for example, a central processing unit (CPU), a read only memory (ROM), and a random access memory (RAM). In this case, the control unit 5a loads a program stored in the ROM into the RAM and executes the program by the CPU, thereby performing various kinds of processing. FIG. 11 is a block diagram illustrating a configuration of the driving device. The control unit 5a may include a controller.

The control unit 5a totally controls the driving device 5. A control signal that instructs driving of the vibration device 3 is input to the control unit 5a. The control unit 5a outputs a generation signal related to the waveform generation of a drive voltage to the drive voltage generation unit 5b depending on the control signal, in response to receiving the control signal. The control signal includes, for example, a signal indicating whether the user has operated the display panel DP. In this case, the control signal is input from the display device DD to the driving device 5 (control unit 5a). The control unit 5a determines whether the user has operated the display panel DP based on the control signal. The control unit 5a may be included in a control unit of the display device DD.

The drive voltage generation unit 5b generates a drive voltage. The drive voltage generation unit 5b includes a waveform generation circuit 5d. The waveform generation circuit 5d generates a waveform of the driving voltage depending on the generation signal output from the control unit 5a. The waveform generation circuit 5d generates a waveform of a voltage including an alternating component that varies between a positive side and a negative side with respect to a ground potential. The waveform generation circuit 5d generates, for example, a sinusoidal waveform. The drive voltage generation unit 5b generates a driving signal based on the sinusoidal waveform. The drive voltage generation unit 5b outputs a voltage signal (analog signal) indicating the generated drive voltage to the output unit 5c. The output unit 5c amplifies the voltage signal output from the drive voltage generation unit 5b. The output unit 5c outputs a driving signal based on the amplified voltage signal to the vibration device 3 (wiring member 40).

Figure 12:
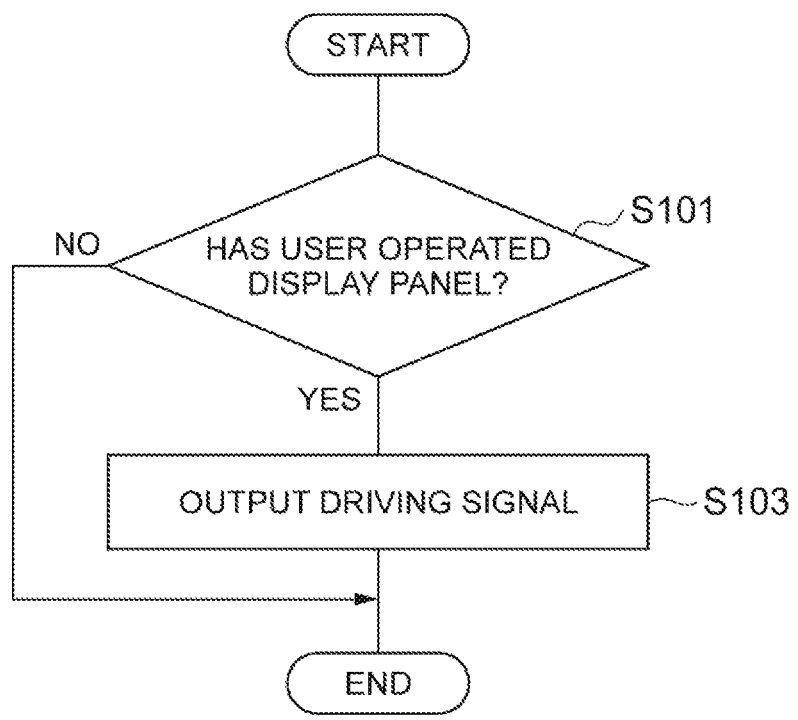
FIG. 12 is a flowchart illustrating an example of the operation of the driving device.

Next, the operation of the driving device 5 will be described with reference to FIG. 12. FIG. 12 is a flowchart illustrating an example of the operation of the driving device 5. The processing of the flowchart illustrated in FIG. 12 is periodically executed, for example, in a case in which a power source of the vehicle V is turned on. The drive voltage generation unit 5b may include a drive voltage generator. The waveform generation circuit 5d may include a waveform generator.

The display device DD periodically outputs a control signal. The control unit 5a determines whether the user has operated the display panel DP based on the control signal output from the display device DD (S101). When the control unit 5a determines that the user has operated the display panel DP, the driving device 5 outputs a driving signal to the vibration device 3 (S103). In this case, the control unit 5a outputs the generation signal to the drive voltage generation unit 5b. Thereafter, the control unit 5a ends current processing. The drive voltage generation unit 5b outputs a voltage signal to the output unit 5c, in response to an input of the generation signal. The output unit 5c outputs the driving signal to the vibration device 3, in response to an input of the voltage signal. The vibration device 3 vibrates in response to an input of the driving signal. Vibration of the vibration device 3 is transmitted to the display panel DP, whereby a tactile sense is presented to the user. When the control unit 5a determines that the user has not operated the display panel DP, the driving device 5 ends current processing without outputting the driving signal to the vibration device 3.

Figure 13:
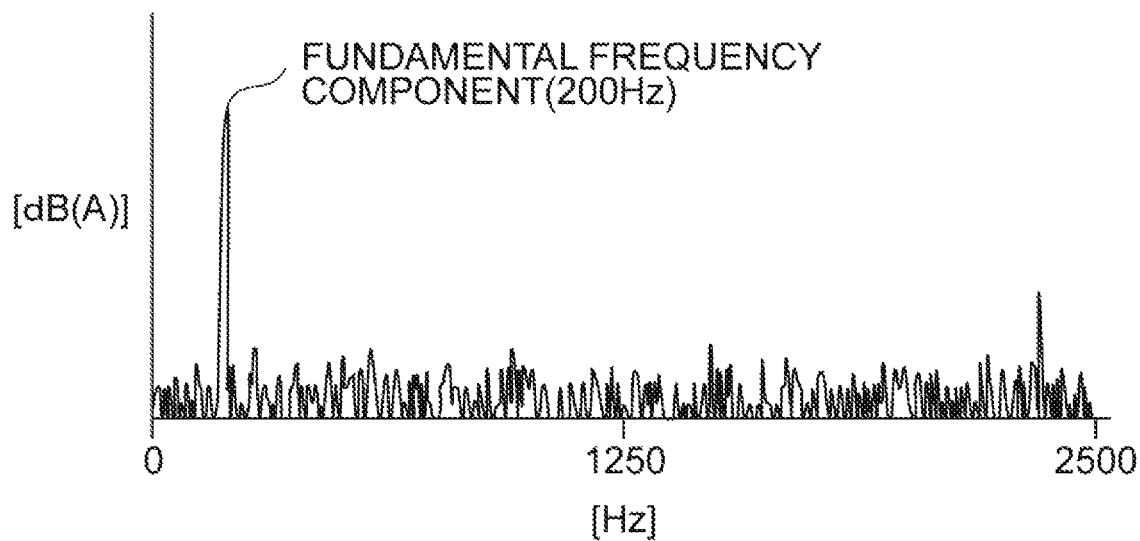
FIG. 13 is a graph illustrating a frequency spectrum of a driving signal input to the vibration device.

In the tactile sense presentation device 1, as described above, the driving signal is input from the driving device 5 to the piezoelectric element 10 through the wiring member 40. As illustrated in FIG. 13, the driving signal input from the driving device 5 to the piezoelectric element 10 includes a fundamental frequency component. FIG. 13 is a graph illustrating a frequency spectrum of a driving signal input to the vibration device.

The fundamental frequency component included in the driving signal is included, for example, in a human audible frequency band. The human audible frequency band generally includes 20 to 20,000 Hz. A human fingertip can sense, for example, a frequency about 20 to 400 Hz. Therefore, in the present embodiment, the fundamental frequency component is set to, for example, 200 Hz. The fundamental frequency component may be set to, for example, 80 Hz. The fundamental frequency component included in the driving signal is lower than a resonance frequency component of the vibration device 3. The resonance frequency component of the vibration device 3 is in the vicinity of the upper limit of the human audible frequency band or outside the human audible frequency band. In the present embodiment, the resonance frequency component of the vibration device 3 is about 40 kHz and outside the human audible frequency band. The driving signal does not approximately include a high order frequency components that is n times (n represents an integer of 2 or more) the fundamental frequency component. The phrase "does not approximately include a high order frequency component" means that an amplitude spectrum of the high order frequency component is one-tenth or less of an amplitude spectrum of the fundamental frequency component in a frequency spectrum obtained by analyzing the driving signal by a fast Fourier transform (FFT).

Figure 14A:
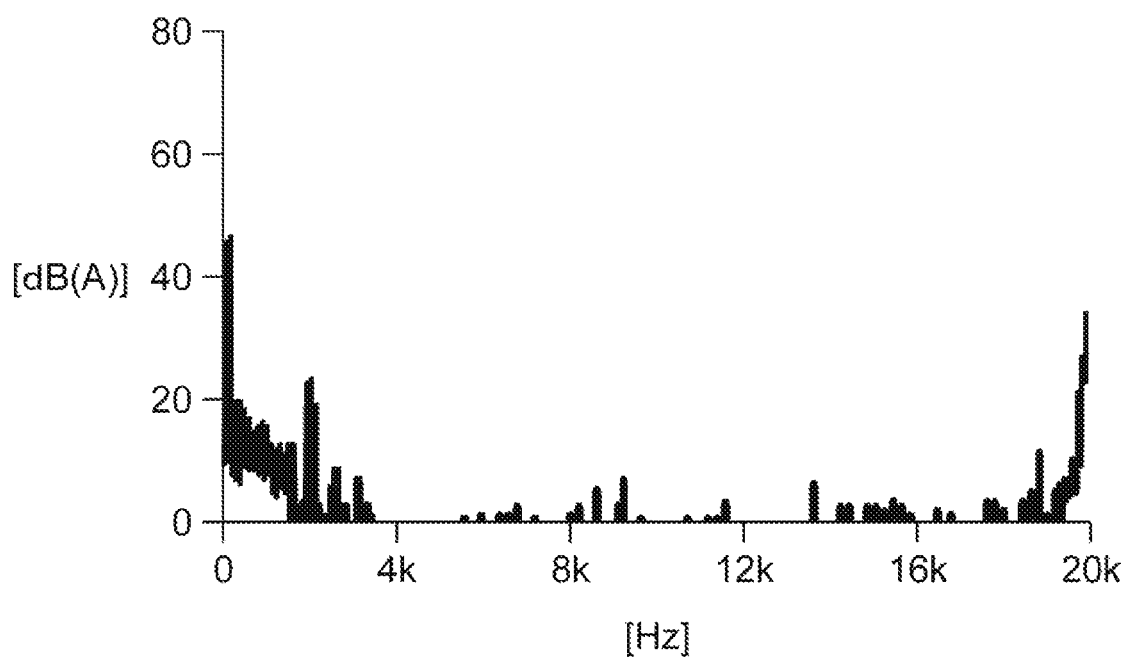
FIGS. 14A and 14B are graphs illustrating frequency spectra of vibration outputs of the vibration device.
Figure 14B:
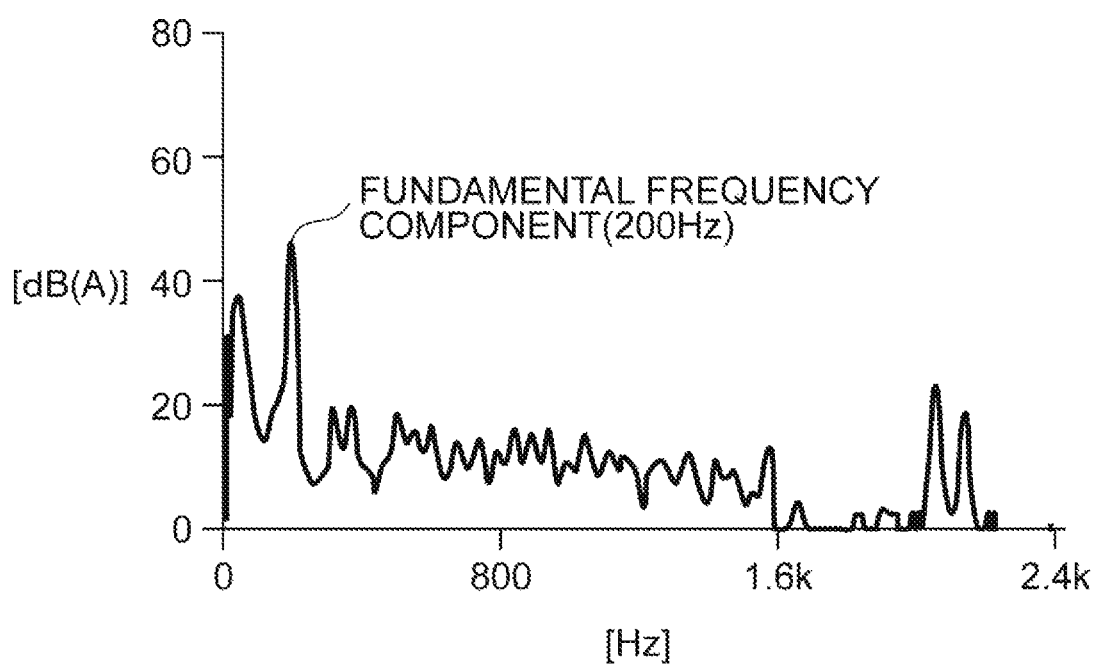

The tactile sense presentation device 1 inputs the above-described driving signal to the piezoelectric element 10. As illustrated in FIGS. 14A and 14B, the tactile sense presentation device 1 vibrates the vibration device 3 in a vibration mode that includes the fundamental frequency component and does not approximately include the high order frequency component that is n times (n is 2 or more) the fundamental frequency component. The phrase "does not approximately include the high order frequency component" means that an amplitude spectrum of the high order frequency component is one-tenth or less of an amplitude spectrum of the fundamental frequency component in a frequency spectrum obtained by analyzing vibration of the vibration device 3 by the FFT. Here, the vibration of the vibration device 3 was detected by a microphone as sound pressure fluctuation of the vibration device 3, and the sound pressure fluctuation detected by the microphone was analyzed by the FFT. In this case, the vibration device 3 is surface-bonded to a vibrating plate including a polycarbonate resin. The size of the vibrating plate is 120 mm×90 mm, and the thickness of the vibrating plate is 2.5 mm. An interval between the microphone and the vibrating plate is 0.1 m. A resonance frequency component of the vibrating plate on which the vibration device 3 is surface-bonded is about 20 kHz. FIGS. 14A and 14B are graphs illustrating the frequency spectra of the vibration outputs of the vibration device. FIG. 14B is a graphs enlarging a part of the frequency spectrum illustrated in FIG. 14A.

As described above, in the present embodiment, the tactile sense presentation device 1 inputs a signal including the fundamental frequency component (for example, of 200 Hz) lower than the resonance frequency component of the vibration device 3 to the piezoelectric element 10 through the wiring member 40. The tactile sense presentation device 1 vibrates the vibration device 3 in the vibration mode that includes a fundamental frequency component (for example, of 200 Hz) and does not approximately include the high order frequency component that is n times the fundamental frequency component. Therefore, the vibration method disclosed in the present embodiment suppresses deterioration of a bonding state between the piezoelectric element 10 and the vibration member 50 and a connection state between the piezoelectric element 10 and the wiring member 40. Consequently, the vibration method disclosed in the present embodiment suppresses a decrease in reliability of the vibration device 3.

In the present embodiment, the fundamental frequency component is included in the human audible frequency band. Consequently, the user strongly perceives the operational tactile sensation.

In the present embodiment, the vibration device 3 is mounted in the vehicle V. In this case, even in the vehicle V including a vibration source other than the vibration device 3, the user strongly perceives the operational tactile sensation.

In the present embodiment, the wiring member 40 includes the base 41 and the plurality of conductors 43 and 45. The base 41 includes the resin and is bonded to the vibration member 50. The plurality of conductors 43 and 45 is disposed on the base 41 and connected with the piezoelectric element 10. In this case, the vibration device 3 suppresses deterioration of a bonding state between the wiring member 40 and the vibration member 50. Therefore, the vibration device 3 further suppresses deterioration of an electrical connection between the piezoelectric element 10 and the wiring member 40.

Figure 15A:
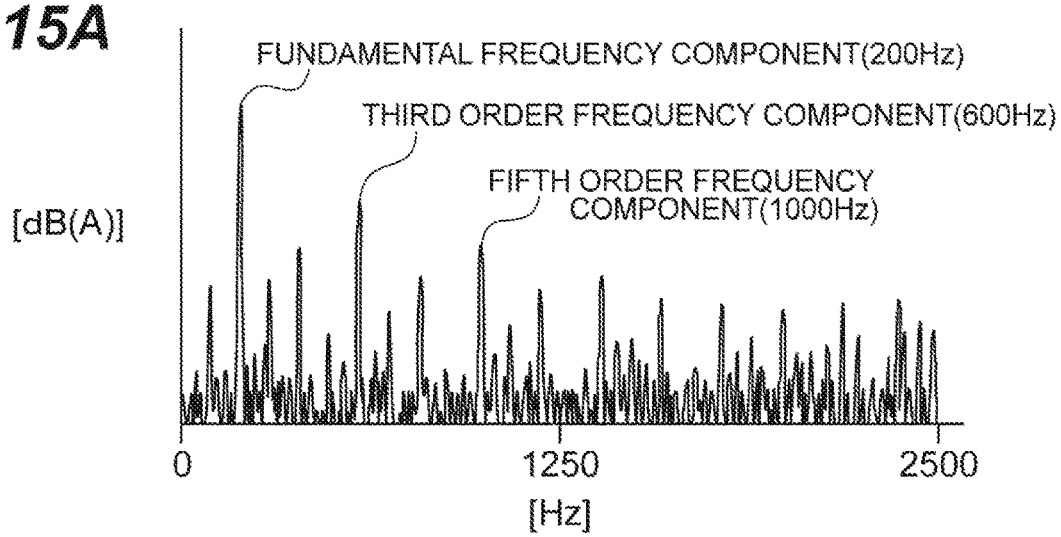
FIGS. 15A, 15B, and 15C are graphs illustrating frequency spectra of driving signals and vibration outputs in comparative examples.
Figure 15B:
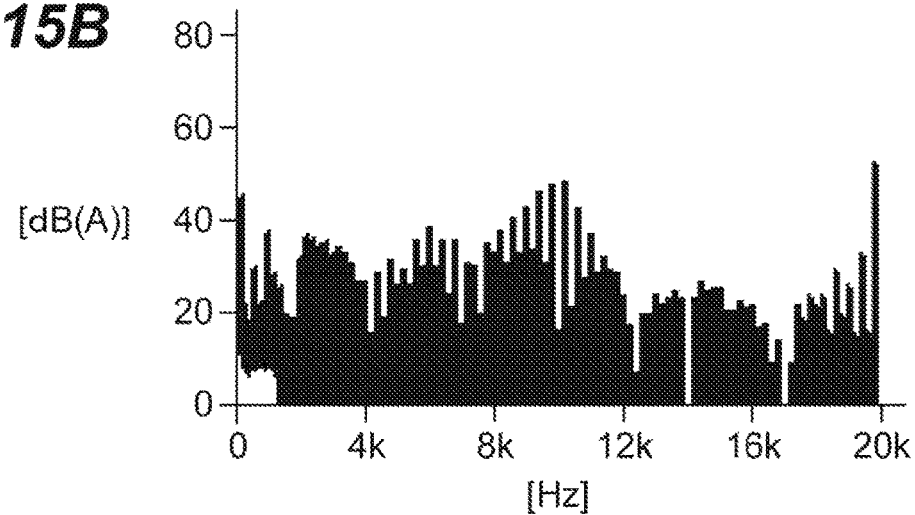
Figure 15C:
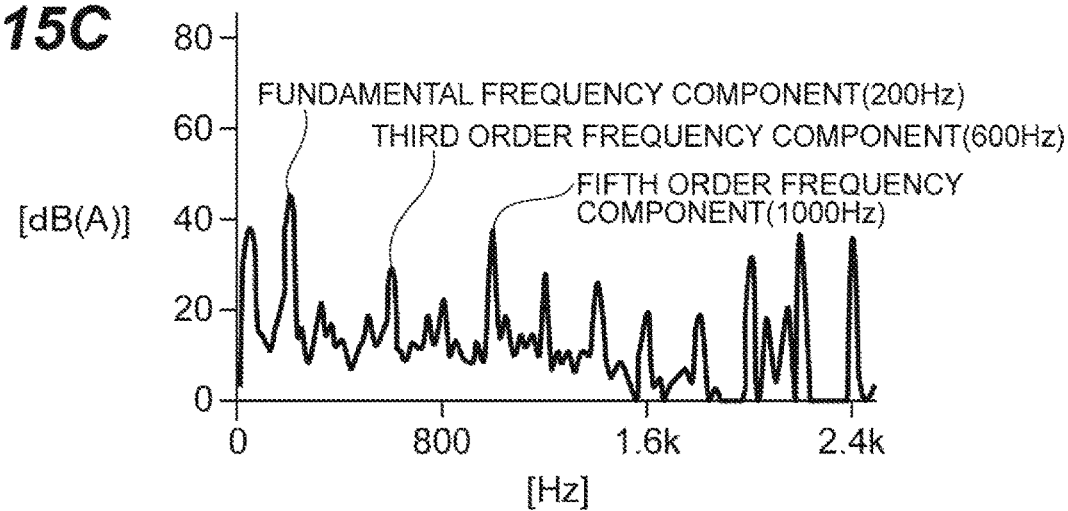
Figure 16A:
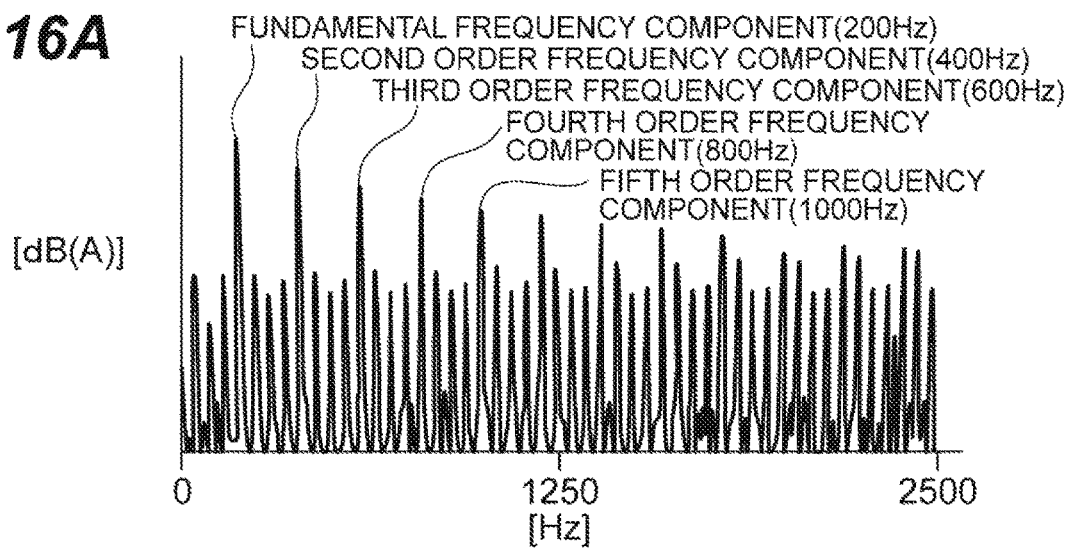
FIGS. 16A, 16B, and 16C are graphs illustrating frequency spectra of driving signals and vibration outputs in comparative examples.
Figure 16B:
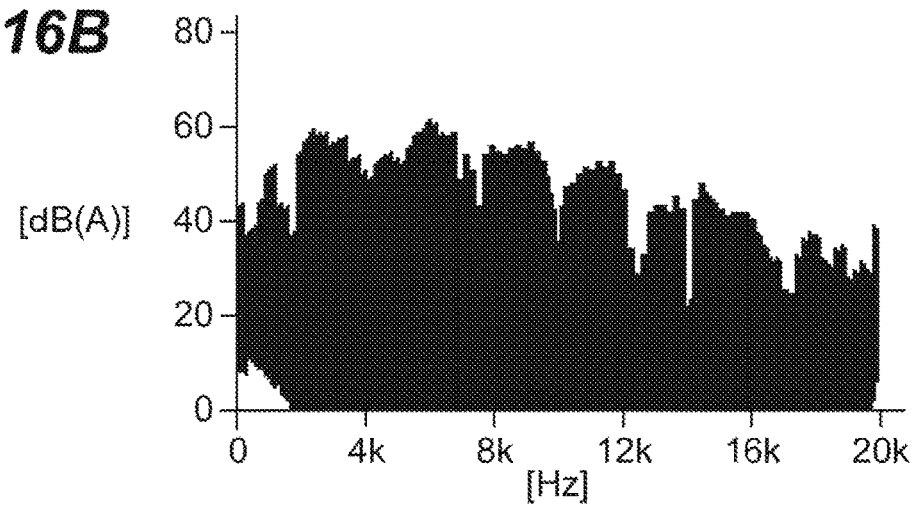
Figure 16C:
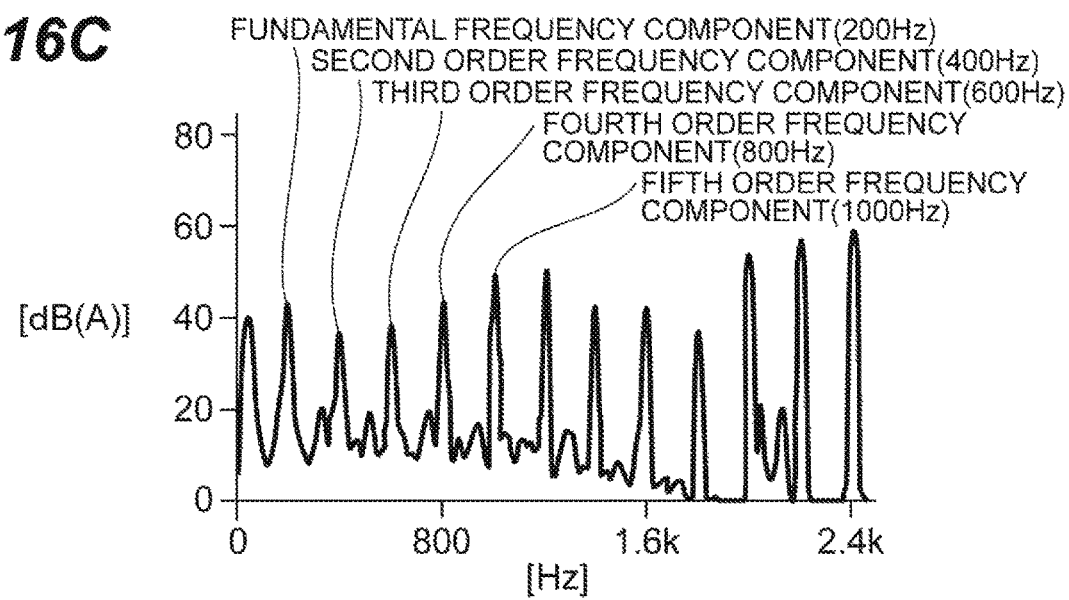
Figure 17A:
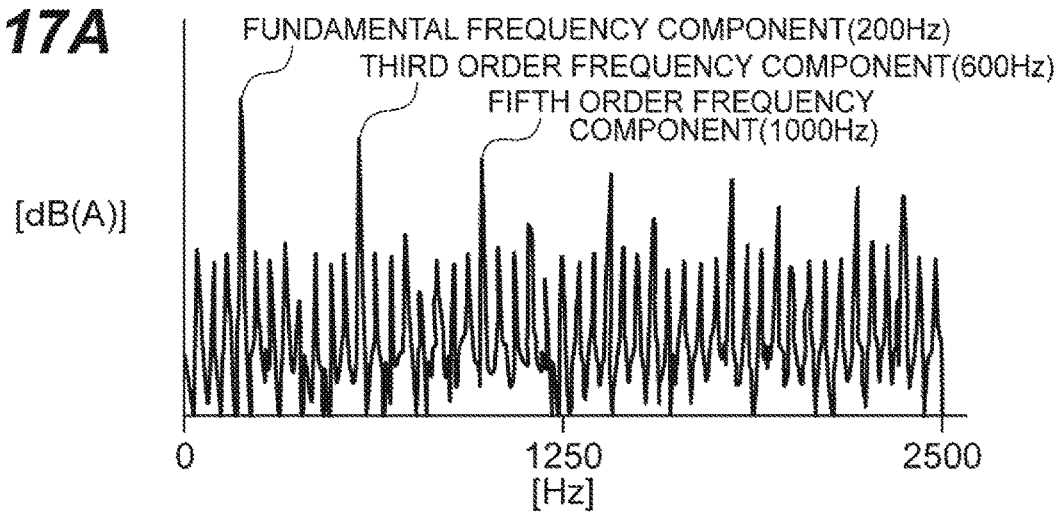
FIGS. 17A, 17B, and 17C are graphs illustrating frequency spectra of driving signals and vibration outputs in comparative examples.
Figure 17B:
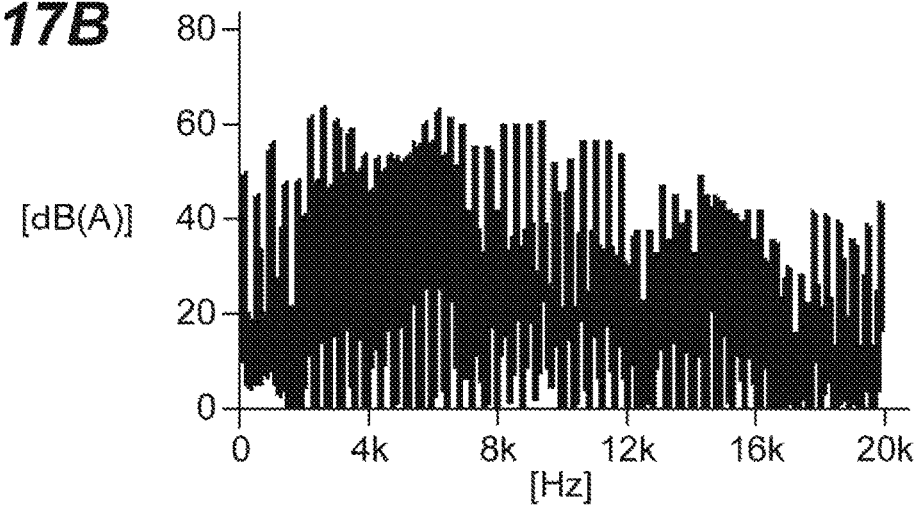
Figure 17C:
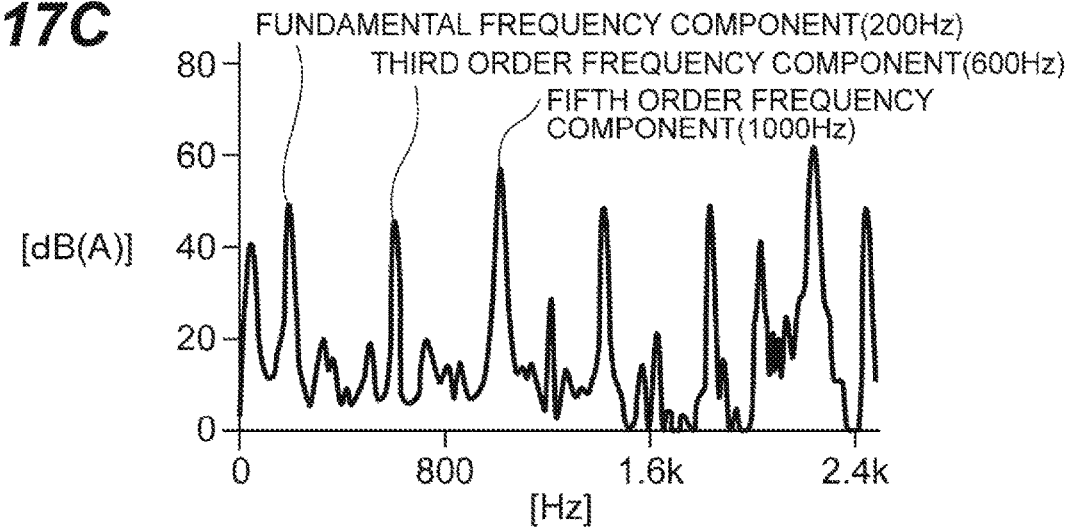

As a result of research and study, the present inventors have confirmed not only that the reliability of the vibration device 3 decreases but also that the user tends not to perceive the operational tactile sensation, in each of the comparative examples illustrated in FIGS. 15A to 15C, FIGS. 16A to 16C, and FIGS. 17A to 17C. In each comparative example, the driving signal includes the high order frequency component that is n times the fundamental frequency component and the vibration device 3 vibrates in a vibration mode that includes the high order frequency component that is n times the fundamental frequency component. In each comparative examples illustrated in FIGS. 15A to 15C, FIGS. 16A to 16C, and FIGS. 17A to 17C, the fundamental frequency component is set to 200 Hz. The vibration device 3 is surface-bonded to the above-described vibrating plate. Also here, vibration of the vibration device 3 was detected by the microphone as sound pressure fluctuation of the vibration device 3, and the sound pressure fluctuation detected by the microphone was analyzed by the FFT to obtain a frequency spectrum. An interval between the microphone and the vibrating plate is 0.1 m. FIGS. 15A to 15C, FIGS. 16A to 16C, and FIGS. 17A to 17C are graphs illustrating the frequency spectra of driving signals and vibration outputs in the comparative examples. FIGS. 15A, 16A, and 17A are graphs illustrating the frequency spectra of the driving signals input to the vibration device. FIGS. 15B, 16B, and 17B are graphs illustrating the frequency spectra of vibration outputs of the vibration device. FIG. 15C is a graph enlarging a part of the frequency spectrum illustrated in FIG. 15B. FIG. 16C is a graph enlarging a part of the frequency spectrum illustrated in FIG. 16B. FIG. 17C is a graph enlarging a part of the frequency spectrum illustrated in FIG. 17B.

Figure 18:
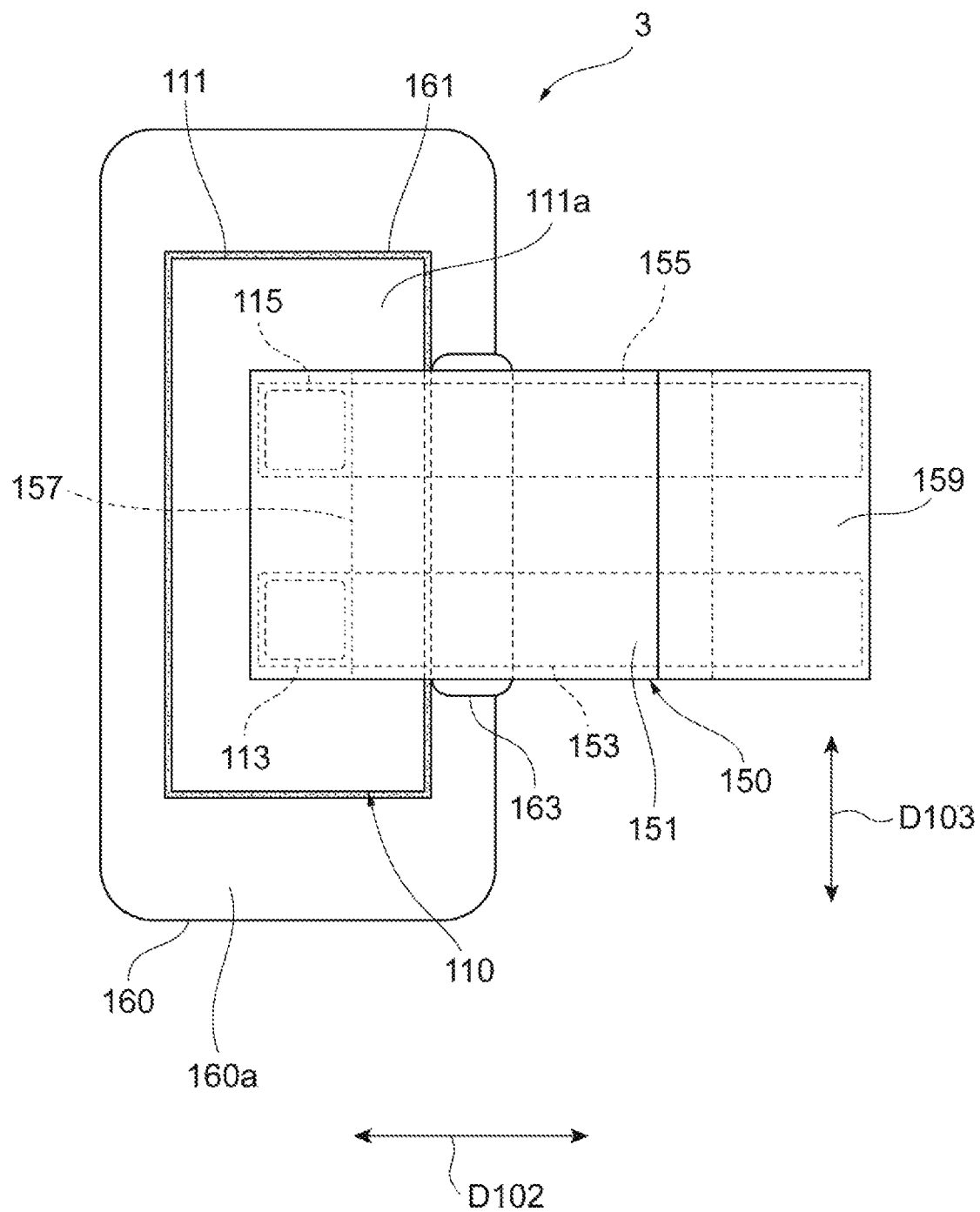
FIG. 18 is a plan view illustrating a modification of the vibration device.
Figure 19:
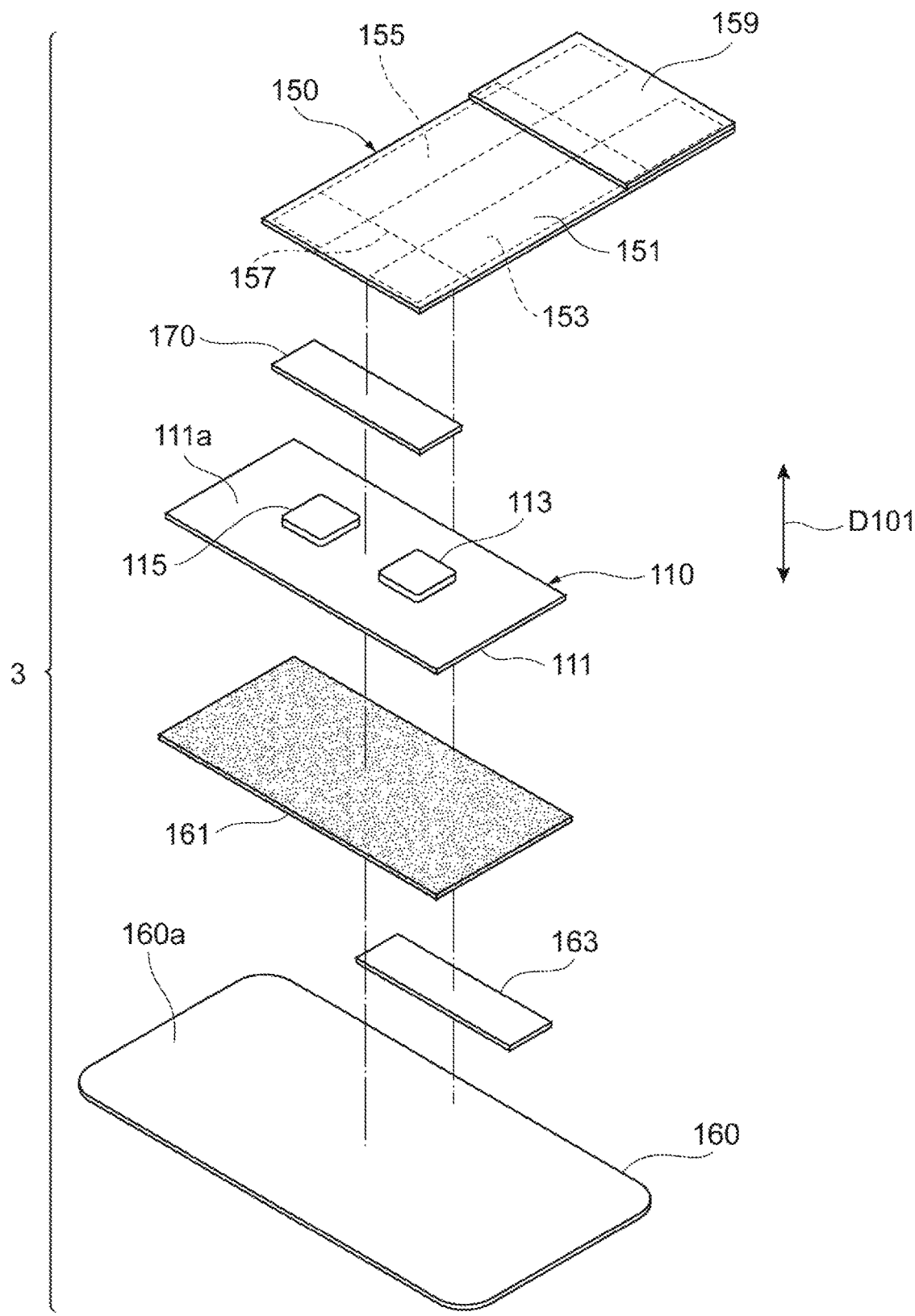
FIG. 19 is an exploded perspective view of the vibration device.
Figure 20:
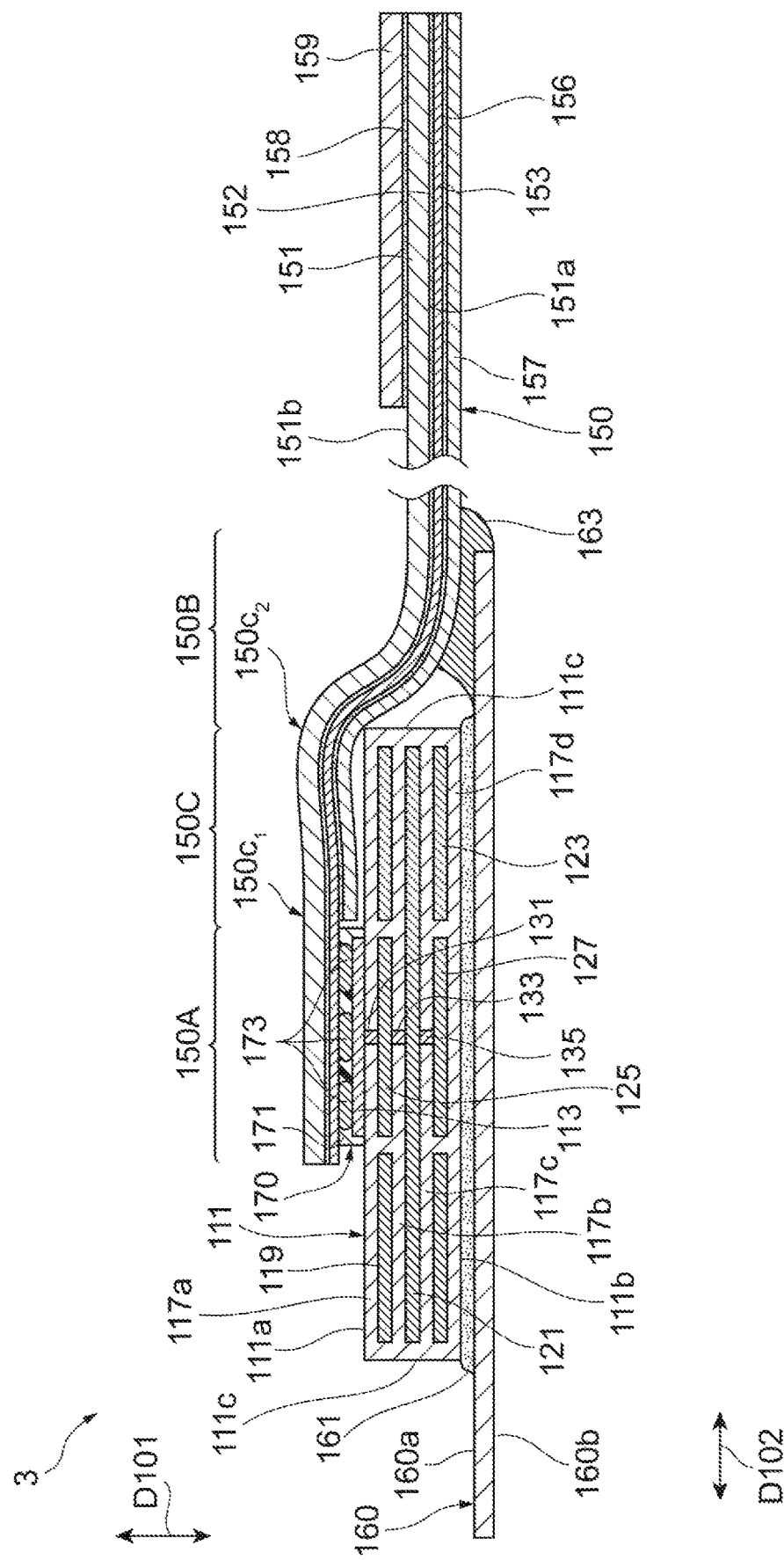
FIG. 20 is a view illustrating a cross-sectional configuration of the vibration device.
Figure 21:
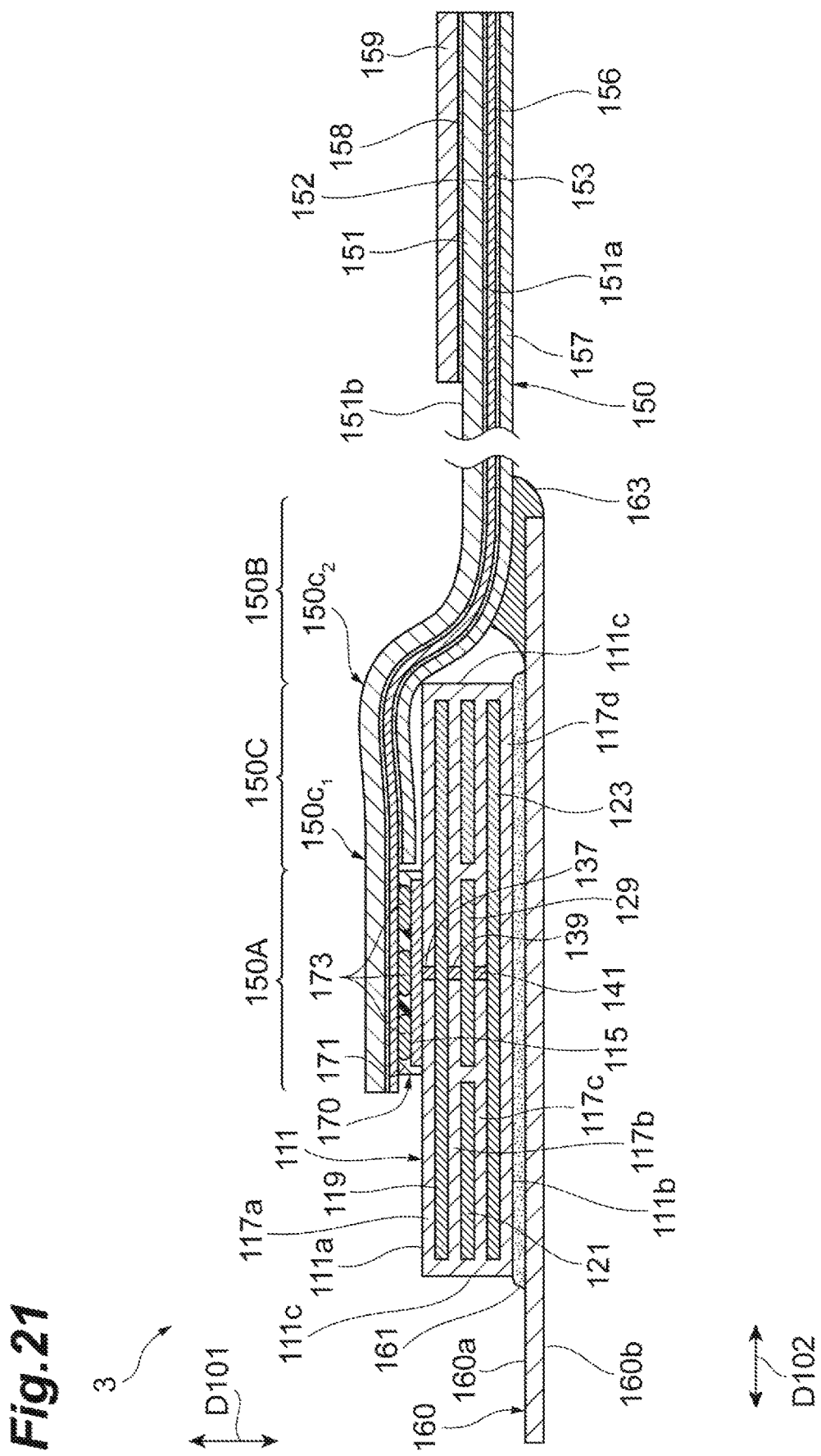
FIG. 21 is a view illustrating a cross-sectional configuration of the vibration device.
Figure 22:
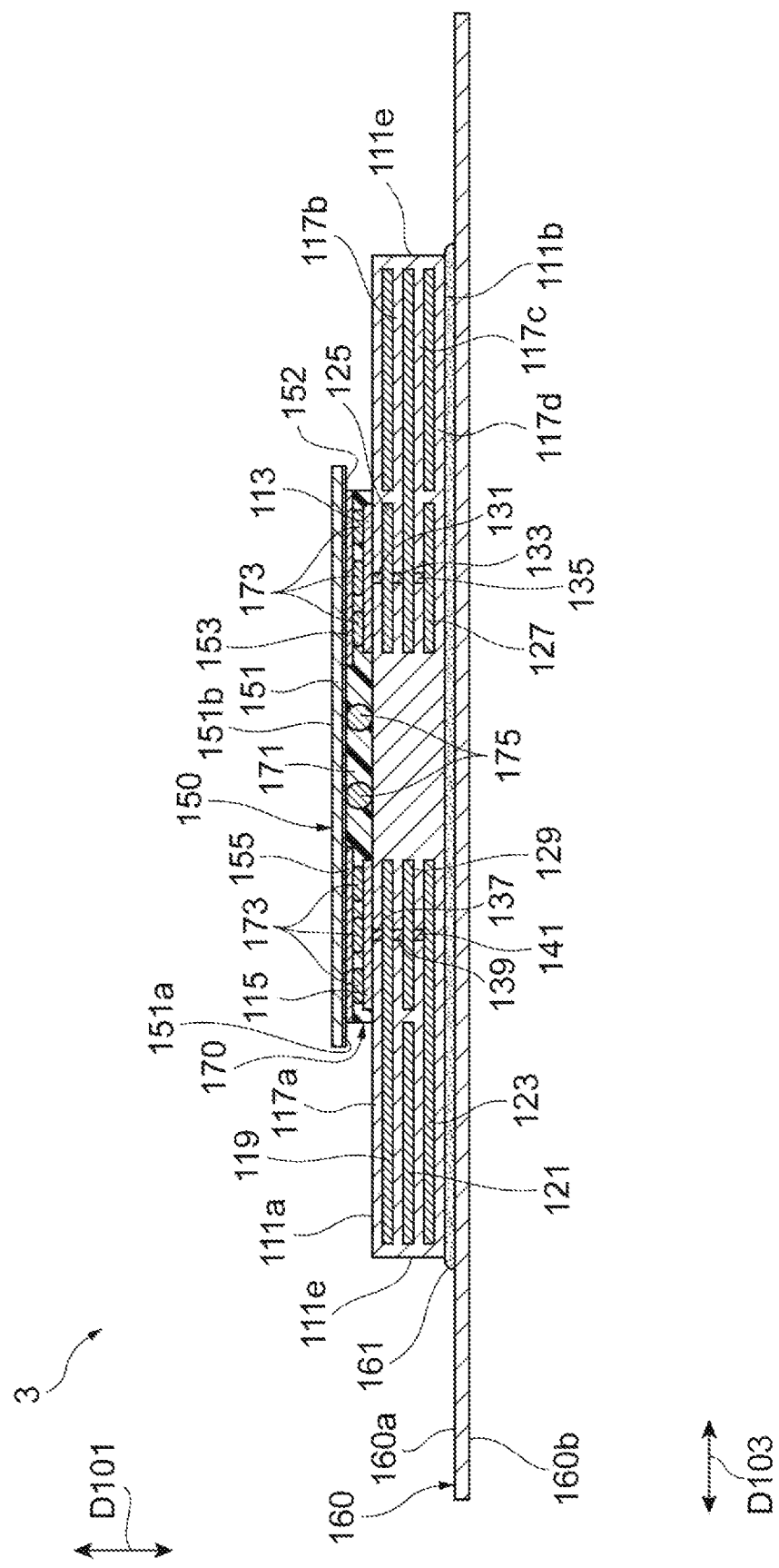
FIG. 22 is a view illustrating a cross-sectional configuration of the vibration device.
Figure 23:
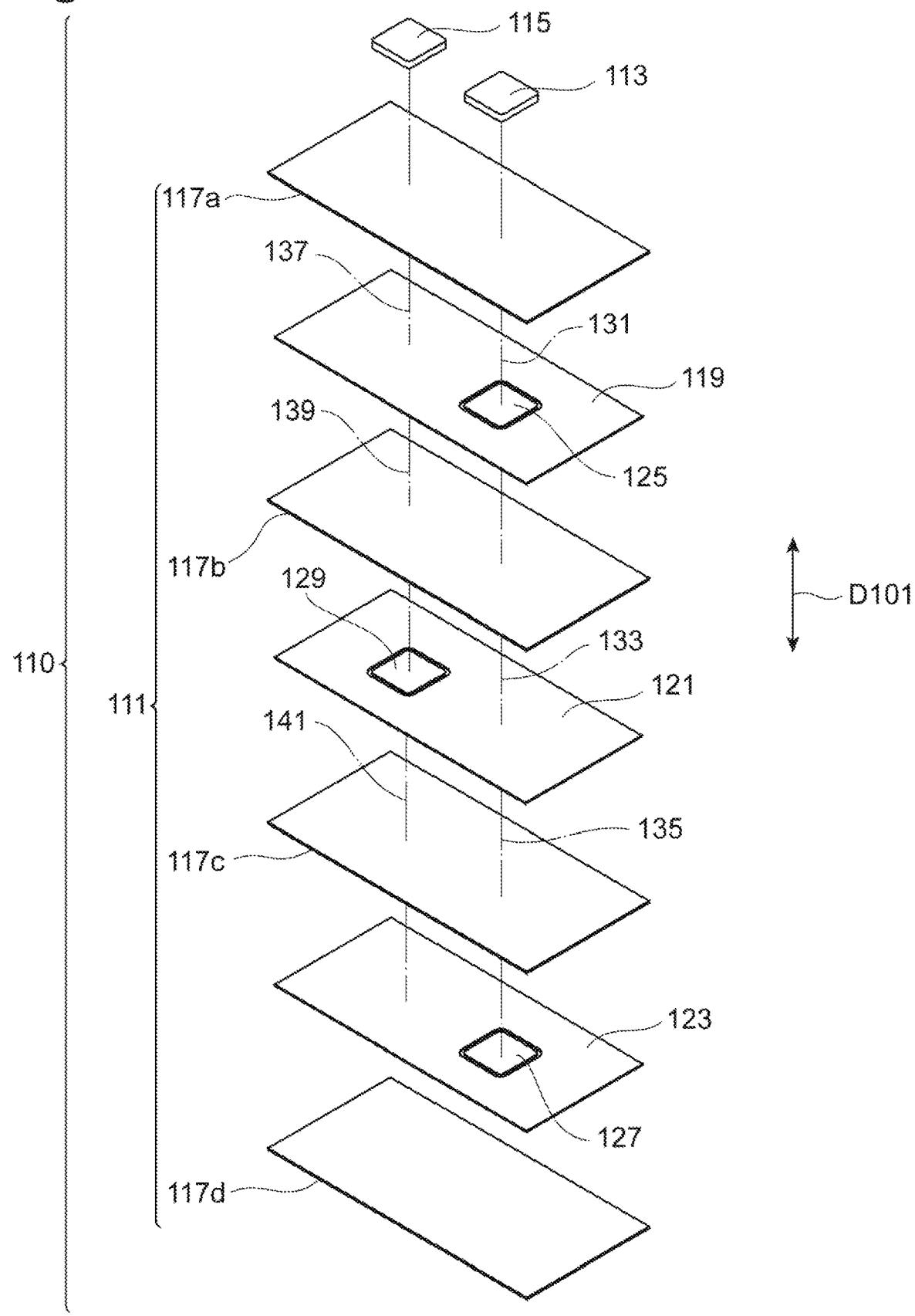
FIG. 23 is an exploded perspective view illustrating a configuration of a piezoelectric element.

Next, a configuration of a modification of the vibration device 3 will be described with reference to FIGS. 18 to 23. FIG. 18 is a plan view illustrating the vibration device. FIG. 19 is an exploded perspective view of the vibration device. FIGS. 20, 21, and 22 are views illustrating cross-sectional configurations of the vibration device. FIG. 23 is an exploded perspective view illustrating a configuration of the piezoelectric element.

As illustrated in FIGS. 18 and 19, the vibration device 3 includes a piezoelectric element 110, a wiring member 150, and a vibration member 160. The piezoelectric element 110 includes a piezoelectric element body 111 and a plurality of external electrodes 113 and 115. In the present modification, the piezoelectric element 110 includes the two external electrodes 113 and 115.

The piezoelectric element body 111 has a rectangular parallelepiped shape. The piezoelectric element body 111 includes a pair of principal surfaces 111a and 111b opposing each other, a pair of side surfaces 111c opposing each other, and a pair of side surfaces 111c opposing each other. The rectangular parallelepiped shape includes a rectangular parallelepiped shape with chamfered corner portions and ridge portions, and a rectangular parallelepiped shape with rounded corner portions and ridge portions. The direction in which the pair of principal surfaces 111a and 111b opposes is a first direction D101. The first direction D101 is a direction orthogonal to the principal surfaces 111a and 111b. The direction in which the pair of side surfaces 111c opposes is a second direction D102. The second direction D102 is a direction orthogonal to the side surfaces 111c. The direction in which the pair of side surfaces 111e opposes is a third direction D103. The third direction D103 is a direction orthogonal to the side surfaces 111e.

Each of the principal surfaces 111a and 111b includes a pair of long-side edges and a pair of short-side edges. Each of the principal surfaces 111a and 111b has a rectangular shape having the pair of long-side edges and the pair of short-side edges. That is, the piezoelectric element 110 (piezoelectric element body 111) has the rectangular shape having the pair of long-side edges and the pair of short-side edges in a plan view. The rectangular shape includes a rectangular shape with chamfered corners, and a rectangular shape with rounded corners. In the present modification, a long-side edge direction of each of the principal surfaces 111a and 111b accords with the third direction D103. A short-side edge direction of each of the principal surfaces 111a and 111b accords with the second direction D102.

The pair of side surfaces 111c extends in the first direction D101 in such a manner as to couple the pair of principal surfaces 111a and 111b. The pair of side surfaces 111c extends in the third direction D103. The pair of side surfaces 111e extends in the first direction D101 in such a manner as to couple the pair of principal surfaces 111a and 111b. The pair of side surfaces 111e extends in the second direction D102. The length of the piezoelectric element body 111 in the second direction D102 is, for example, 10 mm. The length of the piezoelectric element body 111 in the third direction D103 is, for example, 20 mm. The length of the piezoelectric element body 111 in the first direction D101 is, for example, 200 μm. The principal surfaces 111a and 111b and the side surfaces 111c and 111e may be indirectly adjacent to each other. In this case, a ridge portion is located between each of the principal surfaces 111a and 111b and each of the side surfaces 111c and 111e.

As illustrated in FIGS. 20 to 23, the piezoelectric element body 111 is configured by laminating a plurality of piezoelectric layers 117a, 117b, 117c, and 117d in the first direction D1. The piezoelectric element body 111 includes the plurality of laminated piezoelectric layers 117a, 117b, 117c, and 117d. In the present modification, the piezoelectric element body 111 includes the four piezoelectric layers 117a, 117b, 117c, and 117d. In the piezoelectric element body 111, the direction in which the plurality of piezoelectric layers 117a, 117b, 117c, and 117d is laminated accords with the first direction D101. The piezoelectric layer 117a includes the principal surface 111a. The piezoelectric layer 117d includes the principal surface 111b. The piezoelectric layers 117b and 117c are located between the piezoelectric layer 117a and the piezoelectric layer 117d.

Each of the piezoelectric layers 117a, 117b, 117c, and 117d contains a piezoelectric material. In the present modification, each of the piezoelectric layers 117a, 117b, 117c, and 117d contains a piezoelectric ceramic material. Examples of the piezoelectric ceramic material include PZT[Pb(Zr, Ti)O₃], PT(PbTiO₃), PLZT[(Pb, La)(Zr, Ti)O₃], and barium titanate (BaTiO₃). Each of the piezoelectric layers 117a, 117b, 117c, and 117d is composed of a sintered body of a ceramic green sheet containing the above-described piezoelectric ceramic material, for example. In the actual piezoelectric element body 111, the piezoelectric layers 117a, 117b, 117c, and 117d are integrated to such an extent that boundaries between each two of the piezoelectric layers 117a, 117b, 117c, and 117d cannot be recognized.

As illustrated in FIGS. 20 to 23, the piezoelectric element 110 includes a plurality of internal electrodes 119, 121, and 123 disposed in the piezoelectric element body 111. In the present modification, the piezoelectric element 110 includes the three internal electrodes 119, 121, and 123. Each of the internal electrodes 119, 121, and 123 contain a conductive material. As the conductive material, Ag, Pd, or an Ag—Pd alloy is used, for example. Each of the internal electrodes 119, 121, and 123 is composed as a sintered body of a conductive paste containing the above-described conductive material. In the present modification, an outline shape of each of the internal electrodes 119, 121, and 123 includes a rectangular shape.

The internal electrodes 119, 121, and 123 are disposed at different positions (layers) in the first direction D101. The internal electrode 119 and the internal electrode 121 oppose each other with a space in the first direction D101. The internal electrode 121 and the internal electrode 123 oppose each other with a space in the first direction D101. The internal electrode 119 is located, between the piezoelectric layer 117a and the piezoelectric layer 117b. The internal electrode 121 is located between the piezoelectric layer 117b and the piezoelectric layer 117c. The internal electrode 123 is located between the piezoelectric layer 117c and the piezoelectric layer 117d. The internal electrodes 119, 121, and 123 are not exposed to a surface of the piezoelectric element body 111. That is, the internal electrodes 119, 121, and 123 are not exposed to the side surfaces 111c and 111e. Each of the internal electrodes 119, 121, and 123 is separated from all of edges (four side edges) of each of the principal surfaces 111a and 111b as viewed from the first direction D1.

The plurality of external electrodes 113 and 115 is disposed on the principal surface 111a. The external electrodes 113 and 115 are disposed along the third direction D103. The external electrode 113 and the external electrode 115 are adjacent to each other in the third direction D103. Each of the external electrodes 113 and 115 is separated from all of edges (four side edges) of the principal surface ilia as viewed from the first direction D101. Each of the external electrodes 113 and 115 has a rectangular shape as viewed from the first direction D101. The rectangular shape includes a rectangular shape with chamfered corners, and a rectangular shape with rounded corners. Each of the external electrode 113 and 115 contains a conductive material. As the conductive material, Ag, Pd, or an Ag—Pd alloy is used, for example. Each of the external electrodes 113 and 115 is composed as a sintered body of a conductive paste containing the above conductive material.

The external electrode 113 is electrically connected with a connection conductor 125 through a via conductor 131. The connection conductor 125 is located in the same layer as the internal electrode 119. The connection conductor 125 is located inside the internal electrode 119. An opening is formed in the internal electrode 119 at a position corresponding to the external electrode 113 as viewed from the first direction D101. The connection conductor 125 is located in the opening formed in the internal electrode 119. An entire edge of the connection conductor 125 is surrounded by the internal electrode 119 as viewed from the first direction D101.

The connection conductor 125 is located between the piezoelectric layer 117a and the piezoelectric layer 117b. The internal electrode 119 and the connection conductor 125 are separated from each other. The connection conductor 125 opposes the external electrode 113 in the first direction D101. The via conductor 131 is connected with the external electrode 113, and is connected with the connection conductor 125. The connection conductor 125 is electrically connected with the internal electrode 121 through a via conductor 133. The connection conductor 125 opposes the internal electrode 121 in the first direction D101. The via conductor 133 is connected with the connection conductor 125, and is connected with the internal electrode 121.

The internal electrode 121 is electrically connected with a connection conductor 127 through a via conductor 135. The connection conductor 127 is located in the same layer as the internal electrode 123. The connection conductor 127 is located inside the internal electrode 123. An opening is formed in the internal electrode 123 at a position corresponding to the external electrode 113 (connection conductor 125) as viewed from the first direction D101. The connection conductor 127 is located in the opening formed in the internal electrode 123. An entire edge of the connection conductor 127 is surrounded by the internal electrode 123 as viewed from the first direction D101.

The external electrode 115 is electrically connected with the internal electrode 119 through a via conductor 137. The internal electrode 119 opposes the external electrode 115 in the first direction D101. The via conductor 137 is connected with the external electrode 115, and is connected with the internal electrode 119.

The internal electrode 119 is electrically connected with a connection conductor 129 through a via conductor 139. The connection conductor 129 is located in the same layer as the internal electrode 121. The connection conductor 129 is located inside the internal electrode 121. An opening is formed in the internal electrode 121 at a position corresponding to the external electrode 115 as viewed from the first direction D101. The connection conductor 129 is located in the opening formed in the internal electrode 121. An entire edge of the connection conductor 129 is surrounded by the internal electrode 121 as viewed from the first direction D101.

The connection conductor 129 is located between the piezoelectric layer 117b and the piezoelectric layer 117c. The internal electrode 121 and the connection conductor 129 are separated from each other. The connection conductor 129 opposes the internal electrode 119 in the first direction D101. The via conductor 139 is connected with the internal electrode 119, and is connected with the connection conductor 129. The connection conductor 129 is electrically connected with the internal electrode 123 through a via conductor 141. The connection conductor 129 opposes the internal electrode 123 in the first direction D101. The via conductor 141 is connected with the connection conductor 129, and is connected with the internal electrode 123.

The external electrode 113 is electrically connected with the internal electrode 121 through the via conductor 131, the connection conductor 125, and the via conductor 133. The external electrode 115 is electrically connected with the internal electrode 119 through the via conductor 137. The external electrode 115 is electrically connected with the internal electrode 123 through the via conductor 137, the internal electrode 119, the via conductor 139, the connection conductor 129, and the via conductor 141.

Each of the connection conductors 125, 127, and 129 and the via conductors 131, 133, 135, 137, 139, and 141 contain a conductive material. As the conductive material, Ag, Pd, or an Ag—Pd alloy is used, for example. Each of the connection conductors 125, 127, and 129 and the via conductors 131, 133, 135, 137, 139, and 141 is composed as a sintered body of a conductive paste containing the above conductive material. Each of the connection conductors 125, 127, and 129 and the via conductors 131, 133, 135, 137, 139, and 141 are formed by sintering the conductive paste filled in through-holes formed in the ceramic green sheets for forming the corresponding piezoelectric layers 117a, 171b, and 117c.

Conductors electrically connected with the internal electrodes 119 and 123 and conductors electrically connected with the internal electrode 121 are not disposed on the principal surface 111b of the piezoelectric element body 111. In the present modification, when the principal surface 111b is viewed from the first direction D101, the entire principal surface 111b is exposed. The principal surfaces 111a and 111b are the natural surfaces. The natural surface is a surface constituted by a surface of crystal grains grown by firing.

Conductors electrically connected with the internal electrodes 119 and 123 and conductors electrically connected with the internal electrode 121 are not disposed on each of the side surfaces 111c and of the piezoelectric element body 111. In the present modification, when each of the side surfaces 111c is viewed from the second direction D102, the entire side surface 111c is exposed. When each of the side surfaces 111e is viewed from the third direction D103, the entire side surface 111e is exposed. In the present modification, each of the side surfaces 111c and 111e is the natural surface.

A region sandwiched between the internal electrode 119 and the internal electrode 121 in a piezoelectric layer 117b and a region sandwiched between the internal electrode 121 and an internal electrode 23 in a piezoelectric layer 117c constitute a piezoelectric active region. In the present modification, the piezoelectric active region is located in such a manner as to surround a plurality of external electrodes 113 and 115 when viewed from a first direction D101. When viewed from the first direction D101, the piezoelectric element body 111 includes the piezoelectric active region in a region positioned between the external electrode 113 and the external electrode 115. When viewed from the first direction D101, the piezoelectric element body 111 includes the piezoelectric active region also outside the region where the external electrode 113 and the external electrode 115 are positioned.

As illustrated in FIGS. 20 to 22, the wiring member 150 includes a base 151, a plurality of conductors 153 and 155, a cover 157, and a reinforcement 159. In the present modification, the wiring member 150 includes the pair of conductors 153 and 155. The wiring member 150 is, for example, a flexible printed circuit board. The wiring member 150 is disposed in such a manner as to intersect with the long-side edges of the principal surfaces 111a and 111b. A direction in which the wiring member 150 extends intersects with the second direction D102. In the present modification, the wiring member 150 is disposed in such a manner as to be orthogonal to the long-side edges of the principal surfaces 111a and 111b. The direction in which the wiring member 150 extends is orthogonal to the second direction D102. The wiring member 150 includes one end portion and another end portion. The one end portion included in the wiring member 150 is electrically and physically connected with the piezoelectric element 110. The other end portion included in the wiring member 150 is electrically and physically connected with an electronic device (not illustrated) on which the vibration device 3 is mounted. The wiring member 150 may include a wiring board.

The base 151 includes a pair of principal surfaces 151a and 151b opposing each other. The base 151 has electrical insulation properties. The base 151 contains, for example, a polyimide resin. The base 151 may include a resin film.

The pair of conductors 153 and 155 is disposed on the base 151 (principal surface 151a). The pair of conductors 153 and 155 is bonded to the base 151 by an adhesive layer 152. The adhesive layer 152 is located between the conductors 153 and 155 and the base 151. The conductors 153 and 155 extend in the direction in which the wiring member 150 extends. The conductors 153 and 155 are separated from each other in a direction intersecting with a direction in which the conductor 153 and 155 extend. Each of the conductors 43 and 45 contains, for example, copper.

The cover 157 is disposed on the conductors 153 and 155 in such a manner as to cover a part of the conductors 153 and 155. The conductors 153 and 155 are exposed from the cover 157 at the one end portion and the other end portion of the wiring member 150. The cover 157 is also disposed on the principal surface 151a in such a manner as to cover a region exposed from the conductors 153 and 155 of the base 151. The cover 157 is bonded to the conductors 153 and 155 by an adhesive layer 156.

The base 151 is exposed from the cover 157 at the one end portion and the other end portion included in the wiring member 150. The base 151 and the cover 157 are bonded to each other in a region exposed from the conductors 153 and 155. The cover 157 contains a resin. The cover 157 contains, for example, a polyimide resin. For example, gold flash plating is applied to regions of the conductors 153 and 55 exposed from the cover 157. The cover 157 may include a coating film.

The reinforcement 159 is disposed on the other end portion included in the wiring member 150. The reinforcement 159 is disposed on the base 151 (principal surface 151b). The reinforcement 159 is bonded to the base 151 by an adhesive layer 158. The adhesive layer 158 is located between the reinforcement 159 and the base 151. The reinforcement 159 includes a plate-like member having electrical insulation properties. The reinforcement 159 contains, for example, a polyimide resin. The reinforcement 159 may include a reinforcement plate.

As illustrated in FIGS. 20 to 22, the vibration member 160 includes principal surfaces 160a and 160b opposing each other. In the present modification, the vibration member 160 is a plate-like member. The vibration member 160 contains, for example, a metal. The vibration member 160 contains, for example, a Ni—Fe alloy, Ni, brass, or stainless steel. Each of the principal surfaces 160a and 160b includes a pair of long-side edges and a pair of short-side edges. Each of the principal surfaces 160a and 160b has a rectangular shape having the pair of long-side edges and the pair of short-side edges. That is, the vibration member 160 has the rectangular shape having the pair of long-side edges and the pair of short-side edges in plan view. In the present modification, a long-side edge direction of each of the principal surfaces 160a and 160b accords with the third direction D103. A short-side edge direction of each of the principal surfaces 160a and 160b accords with the second direction D102. The length of the vibration member 160 in the second direction D102 is, for example, 15 mm. The length of the vibration member 160 in the third direction D103 is, for example, 30 mm. The length of the vibration member 160 in the first direction D101 is, for example, 100 μm. The vibration member 160 may include a vibrating plate or a diaphragm.

The piezoelectric element 110 is bonded to the vibration member 160 by a resin layer 161. The principal surface 111b of the piezoelectric element body 111 and the principal surface 160a of the vibration member 160 oppose each other. The resin layer 161 is located between the principal surface 111b and the principal surface 160a. The principal surface 111b and the principal surface 160a are bonded to each other by the resin layer 161. The resin layer 161 contains a resin (an epoxy resin, an acrylic resin, or the like). The resin layer 161 contains no conductive filler and has electrical insulation properties. In a state in which the piezoelectric element 110 is bonded to the vibration member 160, the first direction D101 and the direction in which the principal surface 160a and the principal surface 160b oppose are approximately the same. The piezoelectric element 110 is disposed in a central portion of the vibration member 160 (principal surface 160a) as viewed from the first direction D101.

The wiring member 150 is also disposed in such a manner as to intersect the long-sides of the principal surfaces 160a and 160b of a vibration member 160. In the present modification, the wiring member 150 is disposed in such a manner as to be orthogonal to the long-sides of the principal surfaces 160a and 160b. As illustrated in FIGS. 20, 21, and 23, the wiring member 150 includes three regions 150A, 150B, and 150C.

The region 150A is positioned on the external electrodes 113 and 115. The region 150A is included in one end portion of the wiring member 150. The region 150A includes the base 151 and the conductors 153 and 155. The region 150A integrally covers the external electrode 113 and the external electrode 115 when viewed from the first direction D101. The principal surface 111a includes a surface region positioned between the external electrode 113 and the external electrode 115 when viewed from the first direction D101. The region 150A also covers the above-mentioned surface region of the principal surface 111a. The region 150A opposes the external electrodes 113 and 115 and the principal surface 111a (above-mentioned surface region). In the region 150A, each of the conductors 153 and 155 is exposed. In the region 150A, the base 151 and the principal surface 111a oppose each other.

The region 150A is bonded to the piezoelectric element 110 by a connecting member 170. The region 150A is bonded to the external electrodes 113 and 115 by the connecting member 170. The connecting member 170 is disposed between the region 150A and the piezoelectric element 110. The connecting member 170 integrally covers the external electrode 113 and the external electrode 115 when viewed from the first direction D101. The connecting member 170 includes a resin layer 171 and a plurality of metal particles 173. In the present modification, the resin layer 171 exists between the region 150A, and the external electrodes 113 and 115 and principal surface 111a. The resin layer 171 is present between the external electrodes 113 and 115 and the conductors 153 and 155 that correspond to each other. The plurality of metal particles 173 is disposed in the resin layer 171. The resin layer 171 includes, for example, a thermosetting elastomer. The metal particles 173 include, for example, gold plating particles. The connecting member 170 is formed, for example, by curing anisotropic conductive paste or an anisotropic conductive film.

The external electrodes 113 and 115 and the conductors 153 and 155 that correspond to each other are connected by the metal particle 173. The external electrodes 113 and 115 and the conductors 153 and 155 that correspond to each other are electrically connected through the metal particle 173. The conductor 153 is electrically connected with the internal electrode 121 through the metal particle 173 and the external electrode 113. The conductor 155 is electrically connected with the internal electrodes 119 and 123 through the metal particle 173 and the external electrode 115. In the present modification, the external electrodes 113 and 115 and the conductors 153 and 155 that correspond to each other are indirectly connected with each other.

In the present modification, the region 150A is bonded to the surface region of the principal surface 111a (region located between the external electrode 113 and the external electrode 115 when viewed from the first direction D101) by the resin layer 171. In the region 150A, the base 151 (adhesive layer 152) is bonded to the principal surface 111a by the resin layer 171. At least one spacer 175 is disposed between the region 150A and the principal surface 111a (above-mentioned surface region). The spacer 175 is disposed in the resin layer 171. The length of the spacer 175 in the first direction D101 is equal to an interval between the region 150A and the principal surface 111a (above-mentioned surface region). The spacer 175 includes, for example, gold plating particles.

The region 150B is positioned on the principal surface 160a of the vibration member 160. The region 150B includes the base 151, the conductors 153 and 155, and the cover 157. In the region 150B, the conductors 153 and 155 are not exposed. The region 150B is bonded to the principal surface 160a. In the present modification, the region 150B is bonded to the principal surface 160a by a resin layer 163. The cover 157 included in the region 150B is bonded to the principal surface 160a by the resin layer 163. A bonding area between the vibration member 160 (principal surface 160a) and the region 150B (cover 157) is larger than the sum of the area of the external electrode 113 and the area of the external electrode 115.

The resin layer 163 is in contact with the resin layer 161. The resin layer 163 may be separated from the resin layer 161. The resin layer 163 may be in contact with a side surface of the vibration member 160. The resin layer 163 is not in contact with the principal surface 160b of the vibration member 160. That is, the resin layer 163 is not disposed on the principal surface 160b. The resin layer 163 includes, for example, nitrile rubber. The resin layer 163 may include the same material as a material of the resin layer 161. The resin layer 163 may include a material different from the material of the resin layer 161.

A region 150C is positioned on the principal surface 111a of the piezoelectric element body 111 between the region 150A and the region 150B. In the present modification, the region 150C and the region 150A are continuous, and the region 150C and the region 150B are continuous. The region 150O is positioned between the region 150A and the region 150B. The region 150C includes a first end $150C_1$ and a second end $150C_2$. The first end $150C_1$ is positioned closer to the region 150A. The second end $150C_2$ is positioned closer to the region 150B. The region 150C includes the base 151, the conductors 153 and 155, and the cover 157. The region 150C has a curved shape in such a manner as to protrude in a direction away from the principal surface 111a when viewed from the second direction D102.

In the vibration device 3 according to the present modification, when voltages having different polarities are applied to the external electrode 113 and the external electrode 115 through the conductors 153 and 155, an electric field occurs between the internal electrode 121 and the internal electrode 119, and an electric field occurs between the internal electrode 121 and the internal electrode 123. A region in the piezoelectric layer 117b, the region being sandwiched between the internal electrode 119 and the internal electrode 121, and a region in the piezoelectric layer 117c, the region being sandwiched between the internal electrode 121 and the internal electrode 123 serve as active regions, and thus displacement occurs in the active regions. When an AC voltage is applied to the external electrodes 113 and 115, the piezoelectric element 110 repeats expansion and contraction in accordance with the frequency of the applied AC voltage. The piezoelectric element 110 and the vibration member 160 are bonded to each other. Therefore, the vibration member 160 performs flexural vibration integrally with the piezoelectric element 110 in accordance with the repetition of expansion and contraction in the piezoelectric element 110.

Even in a case in which the tactile sense presentation device 1 includes the vibration device 3 of the present modification, the tactile sense presentation device 1 inputs a signal including a fundamental frequency component lower than a resonance frequency component of the vibration device 3 to the piezoelectric element 110 through the wiring member 150. The tactile sense presentation device 1 vibrates the vibration device 3 in a vibration mode that includes a fundamental frequency component and does not approximately include a high order frequency component that is n times the fundamental frequency component. Therefore, the vibration method of the vibration device 3 of the present modification suppresses deterioration of a bonding state of the piezoelectric element 110 and the vibration member 160 and a connection state of the piezoelectric element 110 and the wiring member 150. Consequently, the vibration method of the vibration device 3 of the present modification suppresses a decrease in reliability of the vibration device 3. In a case in which the fundamental frequency component is included in a human audible frequency band, a user strongly perceives an operational tactile sensation. The resonance frequency component of the vibration device 3 of the present modification is about 70 kHz.

The embodiments and modifications of the present invention have been described. The present invention is not necessarily limited to the above-described embodiments and modifications, and various modifications can be made without departing from the gist thereof.

The vibration members 50 and 160 may be a housing of an electronic device, for example. The vibration members 50 and 160 may be the display panel DP, for example. The vibration members 50 and 160 may be a member different from the housing of the electronic device. The vibration members 50 and 160 may be attached to the housing or the member different from the housing by surface adhesion.

What is claimed is:

1. A method for presenting tactile sense of a tactile sense presentation device, the method comprising:
    providing the tactile sense presentation device including a vibration device, the vibration device including: a piezoelectric element, a vibration member to which the piezoelectric element is bonded, and a wiring member connected with the piezoelectric element;
    inputting a signal including a fundamental frequency component to the piezoelectric element through the wiring member; and
    vibrating the vibration device in a vibration mode that includes the fundamental frequency component and does not approximately include a high order frequency component that is n times (n represents an integer of 2 or more) the fundamental frequency component, the vibration mode being in which an amplitude spectrum of the high order frequency component is 1/10 or less of an amplitude spectrum of the fundamental frequency component in a frequency spectrum obtained by performing fast Fourier transform analysis on vibration of the vibration device; and
    presenting the tactile sense from vibrating the vibration device using the tactile sense presentation device,
    wherein the fundamental frequency component is lower than a resonance frequency component of the vibration device.

2. The method according to claim 1, wherein the fundamental frequency component is included in a human audible frequency band.

3. The method according to claim 2, wherein the vibration device is mounted in a vehicle.

4. The method according to claim 1, wherein the wiring member includes
    a base including a resin and bonded to the vibration member, and
    a plurality of conductors disposed on the base and connected with the piezoelectric element.

5. The method according to claim 1, wherein the wiring member includes
    a first portion physically connected to the piezoelectric element, and
    a second portion physically connected to the vibration member.

6. The method according to claim 5,
    wherein the piezoelectric element includes a principal surface opposing the vibration member, and
    a height position of the first portion in a direction orthogonal to the principal surface is different from a height position of the second portion in the direction orthogonal to the principal surface.

7. The method according to claim 1, wherein the resonance frequency component of the vibration device is near an upper limit of a human audible frequency band or outside the human audible frequency band.

8. The method according to claim 1, wherein
    the piezoelectric element includes a piezoelectric element body including a pair of principal surfaces, and a plurality of internal electrodes disposed in the piezoelectric element body and opposing each other in a direction in which the pair of principal surfaces opposes each other, and
    one of the pair of principal surfaces is bonded to the vibration member.

* * * * *